US006990417B2

(12) United States Patent
Yamaguchi et al.

(10) Patent No.: US 6,990,417 B2
(45) **Date of Patent: *Jan. 24, 2006**

(54) JITTER ESTIMATING APPARATUS AND ESTIMATING METHOD

(75) Inventors: Takahiro Yamaguchi, Tokyo (JP); Masahiro Ishida, Tokyo (JP); Mani Soma, Seattle, WA (US)

(73) Assignees: Advantest Corporation, Tokyo (JP); Mani Soma, Seattle, WA (US)

( * ) Notice: Subject to any disclaimer, the term of this patent is extended or adjusted under 35 U.S.C. 154(b) by 121 days.

This patent is subject to a terminal disclaimer.

(21) Appl. No.: 10/240,182

(22) Filed: Sep. 27, 2002

(65) Prior Publication Data

US 2003/0125888 A1 Jul. 3, 2003

Related U.S. Application Data

(63) Continuation of application No. PCT/JP01/02648, filed on Mar. 29, 2001, which is a continuation of application No. 09/538,135, filed on Mar. 29, 2000, now Pat. No. 6,460,001.

(51) Int. Cl.
*G06F 19/00* (2006.01)

(52) U.S. Cl. .......................... 702/69; 702/66; 375/359; 324/622

(58) Field of Classification Search .................. 702/69, 702/66, 57; 375/226, 359, 360; 324/622
See application file for complete search history.

(56) References Cited

U.S. PATENT DOCUMENTS 6,756,818 B1 * 6/2004 Liu et al. ...................... 326/93
6,781,534 B2 * 8/2004 Karlquist .................... 341/143

FOREIGN PATENT DOCUMENTS

JP 7-218565 8/1995
JP 8-226946 9/1996

OTHER PUBLICATIONS

Patent Abstracts of Japan, Publication No. 08-226946, Date of Publication Sep. 3, 1996, 2 pages.
Patent Abstracts of Japan, Publication No. 07-218565, Date of Publication Aug. 18, 1995, 2 pages.
Takahiro Yamaguchi, Tohoku Daigaku Dentsu Danwakai Kiroku, (1999), vol. 68, No.1, 11 pages.
Takahiro Yamaguchi, Masahiro Ishida, Probo (1999), No. 15, 10 pages.

* cited by examiner

*Primary Examiner*—Kamini Shah
(74) *Attorney, Agent, or Firm*—Osha Liang LLP

(57) ABSTRACT

There is provided a jitter estimating apparatus for calculating phase noise waveform of an input signal and for estimating a peak value, a peak-to-peak value and a worst value of jitter of the input signal, and probability to generate jitter based on the phase noise waveform. Timing jitter sequence, period jitter sequence, and cycle to cycle period jitter sequence of the input signal are calculated and the peak value and the peak to peak value for each jitter, as well as probability to generate jitter may be estimated.

42 Claims, 22 Drawing Sheets

FIG. 12

| METHOD | NUMBER OF EVENTS | $J_{RMS}$ | $J_{PP}$ |
|---|---|---|---|
| Δφ METHOD | 23,255 | 2.4534ps (+0.5%) | 8.0029ps (+15.9%) |
| CORRECTION Δφ METHOD | 23,255 | 2.4404ps (+0.004%) | 8.0029ps (+0.04%) |
| THEORETICAL VALUE | —— | 2.4405ps | 6.9028ps |

FIG. 13A
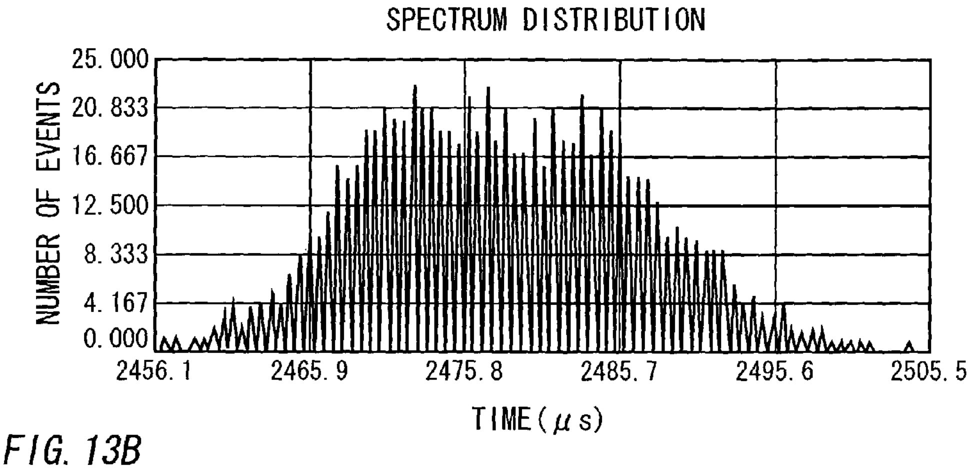
FIG. 13B
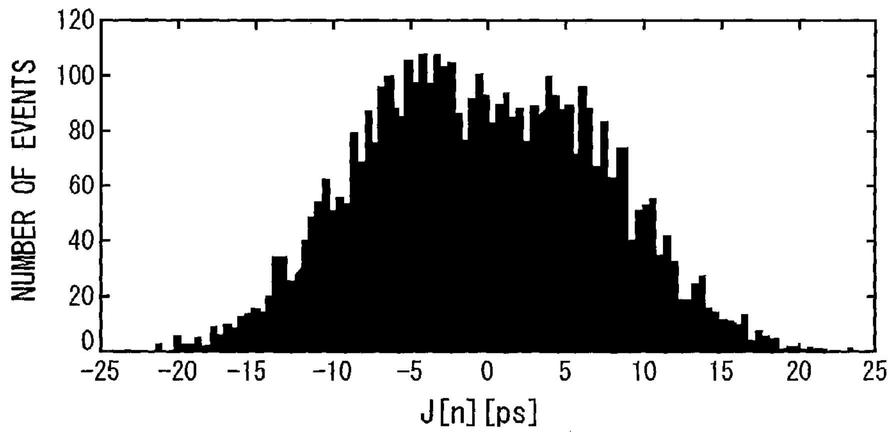
FIG. 14
| METHOD | NUMBER OF EVENTS | $J_{RMS}$ | $J_{PP}$ |
|---|---|---|---|
| TIME INTERVAL ANALYZER | 10,000 | 7.72ps | 48.2ps |
| $\Delta\phi$ METHOD | 4,696 | 7.48ps | 45.2ps |
| ERROR | −53% | −3.1% | +0.4% |

FIG. 16A
FIG. 16B
FIG. 16C
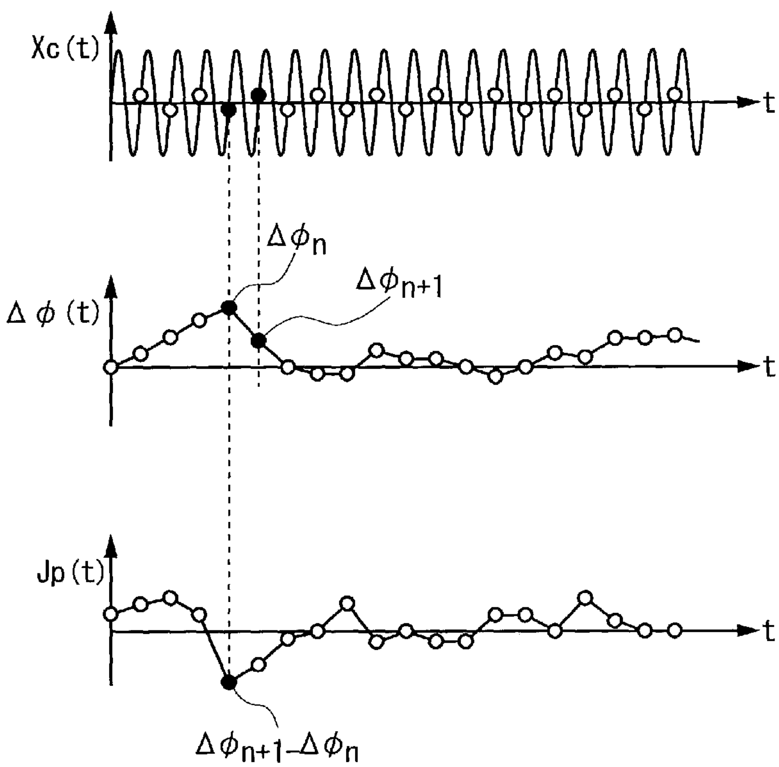
FIG. 17
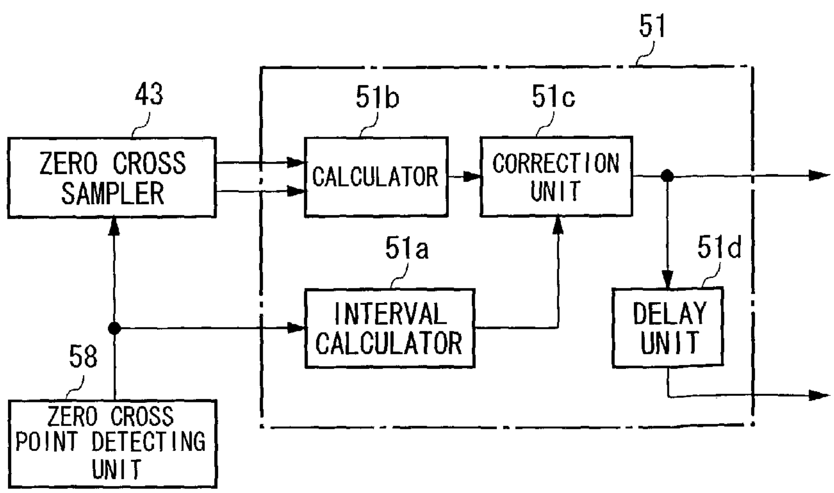

| OPERATION MODE | TIA | Δφ METHOD | | | |
|---|---|---|---|---|---|
| | Jpp | Δφp (PM ONLY) | Δφp (PM+AM) | WORST VALUE | |
| | | | | Jpp | Pr (Jp) |
| QUIESCENT MODE | 57.4ps<br>36.0ps | 31.2ps | 25.7ps | 125ps | 2.1e$^{-10}$ |
| NOISY MODE | 257ps<br>106.2ps | 56.7ps | 58.0ps | 232ps | 1.4e$^{-12}$ |
| NUMBER OF EVENTS | 102000<br>500 | 997 | 997 | 997 | ---- |

JITTER ESTIMATING APPARATUS AND ESTIMATING METHOD

The present patent application is a continuation application of PCT/JP01/02648 filed on Mar. 29, 2001 which is a continuation of U.S. patent application Ser. No. 09/538,135 filed on Mar. 29, 2000, now U.S. Pat. No. 6,460,001 the contents of which are incorporated herein by reference.

BACKGROUND OF THE INVENTION

1. Field of the Invention

The present invention relates to a jitter estimating apparatus and estimating method.

2. Description of the Related Art

A clock frequency of a microprocessor doubles every approximate 40 months. It is necessary to accurately measure jitter in a clock signal according to a shorter clock period. This is because a timing error is avoided in a system operation.

There are period jitter and timing jitter in jitter. For example, an operation frequency of a microprocessor in a computer is limited by period jitter in the clock signal in the microprocessor. Therefore, period jitter becomes a problem. Timing jitter becomes a problem as shift out of an ideal timing point in data communication.

FIGS. 1A to 1C illustrate jitter in the clock signal. In the ideal clock signal which does not include jitter, since an interval $T_{int}$ between a prescribed rise edge of the ideal clock signal and a rise edge adjacent to the prescribed rise edge is constant as shown with a wave of a dotted line in FIG. 1A, period jitter is zero. A rise edge is wobbled before and after an arrow in an actual clock signal. Therefore, interval $T_{int}$ is also wobbled with the wobbling of the rise edge. This wobbling becomes period jitter in the clock signal. Period jitter becomes a problem, for example, in the clock signal of the microprocessor in the computer.

As shown in FIG. 1B, in a case where an ideal pulse signal without jitter is waveform of a broken line, an edge of a pulse signal with jitter (solid line) and the edge of the ideal pulse signal (broken line) is shifted. This shift width is timing jitter.

A time interval analyzer or an oscilloscope is used as means of measuring the jitter. They measure jitter by a method called as a zero cross method.

FIG. 2 illustrates a conventional jitter estimating apparatus using the time interval analyzer. In the conventional jitter estimating apparatus, the time interval analyzer 12 receives a clock signal (tested signal) x(t) output from a tested PLL (phase-locked loop) 11. In the signal x(t), a next rise edge is wobbled against one rise edge as shown with a dotted line in FIG. 2. An interval Tp of both rise edges, that is, a period of the tested signal x(t) is wobbled. The time interval analyzer 12 measures a time interval between zero cross points of the signal x(t), that is, the period of the signal x(t). Histogram analysis for wobbling of the measured period is displayed.

FIG. 3 illustrates histogram of the period measured by the time interval analyzer. About the time interval analyzer, there is described in "Phase Digitizing Sharpens Timing Measurements", by D. Chu (IEEE Spectrum, pp. 28–32, 1988), and "A Method of Serial Data Jitter Analysis Using One-Shot Time Interval Measurements" by J. Wilstrup (Proceeding of IEEE International Test Conference, pp. 819–823, 1998).

FIG. 4 illustrates a jitter estimating apparatus using a digital oscilloscope. FIG. 5 illustrates components of the jitter estimating apparatus in the digital oscilloscope 14. FIGS. 6A and 6B illustrate a tested signal and period jitter measured by the digital oscilloscope.

In recent years, a jitter estimating apparatus to measure jitter using an interpolation method is provided. A method of estimating jitter using the interpolation method (interpolation base jitter estimating method) is a method to measure timing of zero cross by interpolating between measured data close to zero cross in measured data of a sampled tested signal. That is, a time interval (period) between zero cross points is estimated by interpolating data and wobbling of the period is estimated.

The digital oscilloscope 14 receives the tested signal x(t) output from the tested PLL 11. In the digital oscilloscope 14, an A/D converter 15 converts the received tested signal x(t) into a digital signal. An interpolator 16 interpolates a signal value between values in which values of the digital signal is close to zero cross in the digital signal.

A period estimator 17 measures a time interval between zero cross and a histogram estimator 18 displays histogram of the measured value. An RMS and peak-to-peak detector 19 calculates a square mean and peak-to-peak value of wobbling of the measured time interval. In a case where the tested signal x(t) is a wave shown in FIG. 6A, period jitter is measured as shown in FIG. 6B.

It becomes a problem in an application of a computer for example whether or not the microprocessor normally operates even with a state where a worst value of period jitter in the clock signal of the microprocessor, an adjacent edge interval of the clock signal is maximum or minimum caused by the jitter. Based on this point, the quality of a microprocessor is judged by measuring the worst value, for example, of period jitter in the microprocessor and by judging whether or not the worst value is less than a prescribed value.

Especially, in a case of testing an electric device to generate a periodic signal such as a mass manufactured microprocessor, since it is necessary to measure jitter in a short time, the jitter estimating apparatus and the jitter estimating method capable of precisely measuring jitter in the short time are desired.

However, since there is dead time until next period measurement after a first period measurement in the conventional time interval analyzer, it takes time to obtain the number of data needed for histogram analysis. The digital oscilloscope cannot estimate histogram of jitter correctly and therefore jitter is over-evaluated.

SUMMARY OF THE INVENTION

Therefore, it is an object of the present invention to overcome these drawbacks in the prior art.

This object is achieved by combinations described in the independent claims. The dependent claims define further advantageous and exemplary combinations of the present invention.

In order to achieve the object, according to a first aspect of the present invention, there is provided a jitter estimating apparatus for estimating jitter of an input signal, which includes a phase noise detecting unit for calculating phase noise waveform of the input signal, and a worst value estimating unit for calculating a worst value of jitter of the input signal based on phase noise waveform.

It is preferable that the worst value estimating unit includes an absolute value calculator for calculating an absolute value of the phase noise waveform, a maximum value calculator for calculating a maximum value of the absolute value; and a constant multiplication unit for calculating multiplied value as the worst value multiplying the maximum value by constant.

The constant multiplication unit may include a means for calculating the worst value of a peak value of jitter in the input signal by approximately double the maximum value.

It is preferable that a jitter estimating apparatus further includes a timing jitter estimating unit for calculating timing jitter sequence of the input signal based on the phase noise waveform, a period jitter estimating unit for calculating period jitter sequence of the input signal based on timing jitter sequence; an RMS detecting unit for calculating a square mean of period jitter sequence; and a probability calculator for calculating probability in which a worst value of the peak value is generated based on the square mean and the worst value of the peak value.

The constant multiplication unit may include a means for calculating a worst value of a peak-to-peak value of jitter in the input signal by approximately quadruple the maximum value.

A jitter estimating apparatus may further include a timing jitter estimating unit for calculating timing jitter sequence of the input signal based on the phase noise waveform, a period jitter estimating unit for calculating period jitter sequence of the input signal based on timing jitter sequence, an RMS detecting unit for calculating a square mean of the period jitter sequence, and a probability calculator for calculating probability in which a worst value of the peak-to-peak value is generated based on the square mean and the worst value of the peak-to-peak value.

According to the second aspect of the present invention, there is provided a jitter estimating apparatus for estimating jitter of an input signal, which includes a phase noise detecting unit for calculating phase noise waveform of the input signal, and a probability estimating unit for calculating probability in which peak jitter and/or peak-to-peak jitter of the input signal are/is generated.

It is preferable that a jitter estimating apparatus further includes a timing jitter estimating unit for calculating timing jitter sequence of the input signal based on the phase noise waveform, in which the probability estimating unit detects probability in which peak jitter and/or peak-to-peak jitter of the input signal are/is generated based on the timing jitter sequence.

It is preferable that a jitter estimating apparatus further includes a low frequency component remover for removing a frequency component lower than a prescribed frequency from the phase noise waveform, in which the timing jitter estimating unit calculates timing jitter sequence of the input signal based on the phase noise waveform from which the frequency component is removed.

It is preferable that the probability estimating unit includes an RMS detecting unit for calculating a square mean of the phase noise waveform, and a probability calculator for calculating probability in which peak jitter or peak-to-peak jitter of the input signal exceeds a prescribed value based on the square mean.

The probability estimating unit may further include means for calculating a prescribed value by multiplying the square mean by constant.

The probability estimating unit may include an RMS detecting unit for calculating a square mean of the phase noise waveform, a peak-to-peak detecting unit for calculating a peak value and/or the peak-to-peak value of the timing jitter of the input signal based on the phase noise waveform; and a probability calculator for calculating probability in which peak jitter or peak-to-peak jitter of the input signal exceeds the peak value or the peak-to-peak value.

It is preferable that the phase noise detecting unit includes an analytic signal converting unit for converting the input signal into an analytic signal of a complex function, an instantaneous phase estimating unit for calculating an instantaneous phase of the analytic signal, and a linear phase remover for calculating the phase noise waveform by removing a linear phase from the instantaneous phase.

The phase noise detecting unit includes: an analytic signal converting unit for converting the input signal into an analytic signal of a complex function; an instantaneous phase estimating unit for calculating an instantaneous phase of the analytic signal; and a linear phase remover for calculating the phase noise waveform by removing a linear phase from the instantaneous phase.

A jitter estimating apparatus may further include a waveform clipper for removing an amplitude modulating component of the input signal, in which the analytic signal converting unit converts the input signal from which the amplitude modulating component is removed into the analytic signal.

It is preferable that a zero cross detecting unit outputs timing in which the analytic signal is sampled and data near a zero cross point among data of the sampled analytic signal are sampled, and the timing jitter estimating unit calculates timing jitter sequence of the input signal by sampling the phase noise waveform based on the timing.

A jitter estimating apparatus may further include a period jitter estimating unit for calculating period jitter sequence of the input signal based on timing jitter sequence, in which the probability estimating unit calculates probability in which a peak value and/or a peak-to-peak value of period jitter of the input signal exceeds a prescribed value based on the period jitter sequence.

A jitter estimating apparatus further includes a period jitter estimating unit for calculating period jitter sequence of the input signal based on timing jitter sequence, in which the stochastic probability estimating unit calculates stochastic probability in which a peak value and/or a peak-to-peak value of period jitter of the input signal exceeds a prescribed value based on the period jitter sequence.

It is preferable that the period jitter estimating unit includes a difference calculator for calculating difference sequence between timing jitter included in timing jitter output by the timing jitter estimating unit, an interval calculator for calculating an interval of the timing output by the zero cross detecting unit, and a correcting unit for calculating period jitter sequence by correcting the difference sequence based on the interval of the timing and a period of the input signal.

It is preferable that the period jitter estimating unit further includes a delay unit for delaying period jitter sequence calculated by the correcting unit to output the delayed sequence.

A jitter estimating apparatus may further include a cycle-to-cycle period jitter estimating unit for calculating cycle-to-cycle period jitter of the input signal based on the period jitter sequence, in which the probability estimating unit calculates probability in which a peak value and/or a peak-to-peak value of cycle-to-cycle period jitter of the input signal exceeds a prescribed value based on cycle-to-cycle period jitter sequence.

A jitter estimating apparatus may further include a switch for switching any of the linear phase remover, the timing jitter estimating unit, the period jitter estimating unit, and the cycle-to-cycle period jitter estimating unit connected to the probability estimating unit.

According to the third aspect of the present invention, there is provided a method of estimating jitter of an input signal, which includes steps of detecting phase noise to calculate phase noise waveform of the input signal, and estimating a worst value to calculate the worst value of jitter in the input signal based on the phase noise waveform.

It is preferable that the step of estimating the worst value includes steps of calculating an absolute value of the phase noise waveform, calculating a maximum value of an absolute value, and multiplying the maximum value by constant to calculate the multiplied value as the worst value.

The step of multiplying the maximum value by constant may have a step of calculating the worst value of a peak value in the input signal by approximately double the maximum value.

It is preferable that a method of estimating jitter, further includes steps of calculating timing jitter sequence of the input signal based on the phase noise waveform, calculating period jitter sequence of the input signal based on the timing jitter sequence, calculating a square mean of the period jitter sequence, and calculating probability in which a worst value of the peak value is generated based on the square mean and the worst value of the peak value.

The step of multiplying the maximum value by constant may include the step of calculating the worst value of a peak-to-peak value of jitter in the input signal by approximately quadruple the maximum value.

A method of estimating jitter may further include steps of calculating timing jitter sequence of the input signal based on the phase noise waveform, calculating period jitter sequence of the input signal based on the timing jitter sequence, calculating a square mean of the period jitter sequence, and calculating probability in which the worst value of the peak-to-peak value is generated based on the square mean and the worst value of the peak-to-peak value.

According to the third aspect of the present invention, there is provided a method of estimating jitter for estimating jitter of an input signal, which includes steps of detecting phase noise for calculating phase noise waveform of the input signal, and estimating probability for calculating probability in which peak jitter and/or peak-to-peak jitter of the input signal are/is generated based on the phase noise waveform.

It is preferable that a method of estimating jitter further includes a step of estimating timing jitter for calculating timing jitter sequence of the input signal based on the phase noise waveform, in which the step of estimating probability estimates probability in which peak jitter and/or peak-to-peak jitter of the input signal are/is generated based on the timing jitter sequence.

A method of estimating jitter may further include a step of removing a frequency component lower than a prescribed frequency from the phase noise waveform, in which the step of estimating timing jitter calculates timing jitter sequence of the input signal based on the phase noise waveform from which the frequency component is removed.

It is preferable that the step of estimating probability includes steps of calculating a square mean of the phase noise waveform, and calculating probability in which peak jitter or peak-to-peak jitter of the input signal exceeds a prescribed value based on the square mean.

The step of estimating probability may further include a step of calculating a prescribed value by multiplying the square mean by constant.

The step of estimating probability may include steps of: calculating a square mean of the phase noise waveform, detecting a peak-to-peak to calculate a peak value and/or a peak-to-peak value of timing jitter in the input signal based on the phase noise waveform, and calculating probability in which peak jitter or peak-to-peak jitter of the input signal exceeds the peak value or the peak-to-peak value based on the square mean, and the peak value or the peak-to-peak value.

It is preferable that the step of detecting phase noise includes steps of: converting an analytic signal to convert the input signal into the analytic signal of a complex function; calculating an instantaneous phase of the analytic signal; and removing a linear phase to calculate the phase noise waveform by removing a linear phase from the instantaneous phase.

The step of detecting phase noise includes steps of: converting an analytic signal to convert the input signal into the analytic signal of a complex function; calculating an instantaneous phase of the analytic signal; and removing a linear phase to calculate the phase noise waveform by removing a linear phase from the instantaneous phase.

A method of estimating jitter may further include a step of removing an amplitude modulating component of the input signal, in which the step of converting the analytic signal converts the input signal from which the amplitude modulating component is removed into the analytic signal.

It is preferable that a method of estimating jitter further includes a step of sampling the analytic signal to output timing in which data near a zero cross point among data of the analytic signal are sampled, in which the step of estimating timing jitter calculates timing jitter sequence of the input signal by sampling the phase noise waveform based on the timing.

A method of estimating jitter may further include a step of estimating period jitter to calculate period jitter sequence of the input signal based on the timing jitter sequence, in which the step of estimating probability calculates probability in which a peak value and/or peak-to-peak value of period jitter in the input signal exceeds a prescribed value based on the period jitter sequence.

A method of estimating jitter further includes a step of estimating period jitter to calculate period jitter sequence of the input signal based on the timing jitter sequence, in which the step of estimating stochastic probability calculates stochastic probability in which a peak value and/or peak-to-peak value of period jitter in the input signal exceeds a prescribed value.

It is preferable that the step of estimating period jitter includes steps of calculating difference sequence of timing jitter included in timing jitter sequence output in the step of estimating timing jitter, calculating an interval of timing output in the step of detecting the zero cross point, and calculating the period jitter sequence by correcting the difference sequence based on the interval of the timing and a period of the input signal.

It is preferable that the step of estimating period jitter further includes a step of delaying the period jitter sequence calculated in the correcting step to output the delayed sequence.

A method of estimating jitter may further include a step of estimating cycle-to-cycle period jitter to calculate cycle-to-cycle period jitter in the input signal based on the period jitter sequence, in which the step of estimating probability calculates probability in which a peak value and/or peakto-peak value of cycle-to-cycle period jitter in the input signal exceeds a prescribed value based on the cycle-to-cycle period jitter sequence.

This summary of the invention does not necessarily describe all necessary features so that the invention may also be a sub-combination of these described features.

BRIEF DESCRIPTION OF DRAWINGS

The above and other objects and features of the invention will become more apparent from the following detailed description of the preferred embodiments with reference to the attached drawings, wherein:

FIG. 12 illustrates an RMS value $J_{RMS}$ and a peak-to-peak value $J_{pp}$ of period jitter of a tested signal having sine wave jitter;

FIGS. 13A and 13B illustrate histogram of period jitter;

FIG. 14 illustrates the number of events, the RMS value of the period jitter, and the peak-to-peak value of period jitter;

FIGS. 16A to 16C illustrate a real number part $x_c(t)$, phase noise wave $\Delta\phi(t)$, and period jitter $J_p(t)$ of an analytic signal $z_c(t)$;

FIG. 17 illustrates components of a period jitter estimating unit 51;

DETAILED DESCRIPTION OF THE INVENTION

Below, one example of an embodiment in the present invention will be described referring to drawings.

A principle of the present invention is described. In case where instantaneous value J[n] depends on the Gaussian distribution in an irregular process of narrow bandwidth {J(n)}, set value {max(J[n])} of a maximum value of J[n] comes close to Rayleigh distribution when free level n (the number of samplings) is great.

Figure 7A:
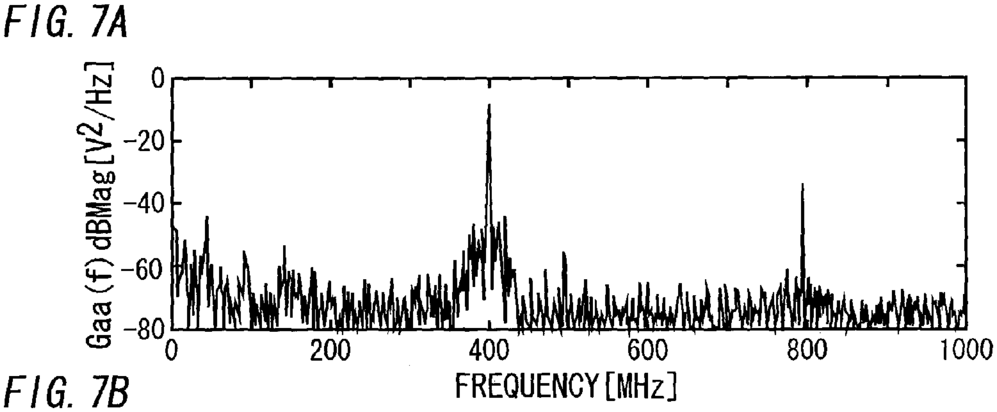
FIGS. 7A and 7B illustrate power spectrum obtained by performing high-speed Fourier transformation for the clock signal of a microprocessor in a computer.

FIG. 7A illustrates a power spectrum in a quiescent mode of a microprocessor, that is, in an inert state of the microprocessor, in the power spectrum by performing a high-speed Fourier transformation for a clock signal of a microprocessor in a computer. The inert state is a state, for example, where the computer awaits an instruction from a user and a state where in a microprocessor, only PLL circuit, which outputs the clock signal by supply of a phase reference with a reference clock, operates and the clock signal is seldom influenced from another unit of the computer.

Figure 7B:
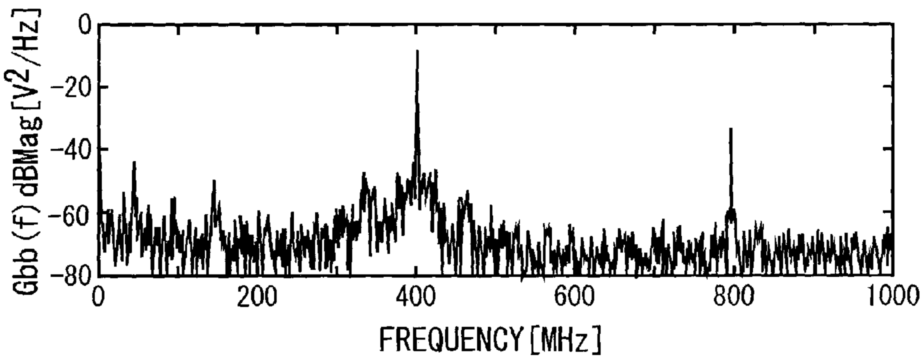

FIG. 7B illustrates a power spectrum in a noisy mode of the microprocessor, that is, in a state where the microprocessor is active. The activation state is a state, for example, where a memory of level 2, a system bus, a core bus, a branch predicting unit, and the like fully operate in the computer and the clock signal is greatly influenced from another unit of the computer.

In FIGS. 7A and 7B, line spectrum of the clock signal appears at 400 MHz, which is a fundamental frequency of the clock signal. Irregular phase noise occurs in a vicinity frequency band of a center frequency around 400 MHz. This shows appearance of narrow bandwidth irregular data.

Figure 8A:
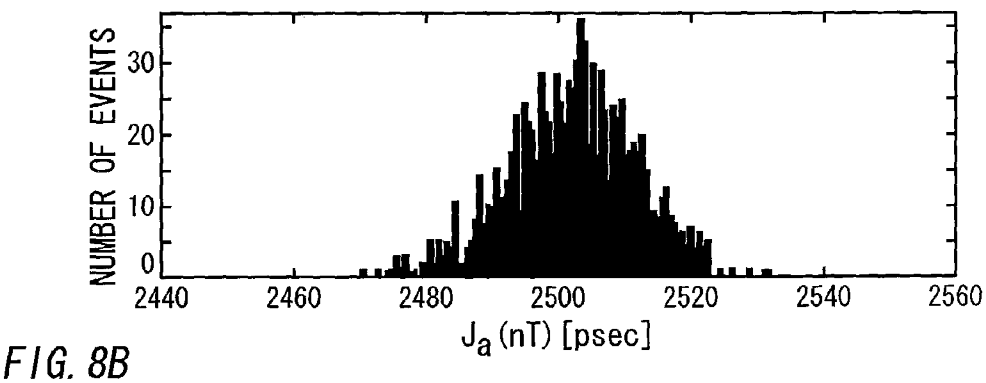
FIGS. 8A and 8B illustrate histogram (probability density function) of jitter in the clock signal (clock jitter) J[n]
Figure 8B:
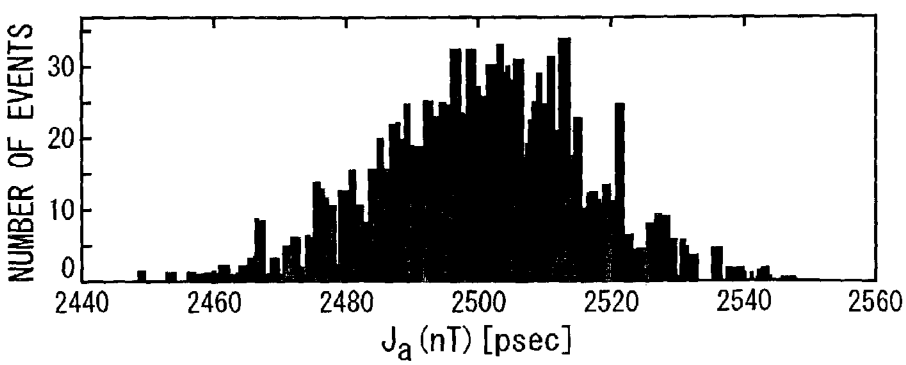

FIG. 8A illustrates a probability density function (histogram) of jitter in clock signal (clock jitter) J[n] in the quiescent mode of the microprocessor and FIG. 8B illustrates histogram of clock jitter J[n] in a noisy mode of the microprocessor. The probability density function of clock jitter J[n] is accordance with Gaussian distribution.

A set $\{J_p\}$, which is {max(J[n])}, of a peak value of period jitter (peak jitter) in the clock signal is in accordance with Rayleigh distribution from a view point of irregular phase noise, instantaneous value J[n] of clock jitter, according to Gaussian distribution.

Probability density function $P_r(J_p)$ of Rayleigh distribution is obtained by the following formula.

$$P_r(J_p) = \frac{J_p}{\sigma_J^2}\exp\left(-\frac{J_p^2}{2\sigma_p^2}\right) \quad J_p > 0$$
$$= 0 \quad J_p < 0 \tag{1}$$

Figure 9:
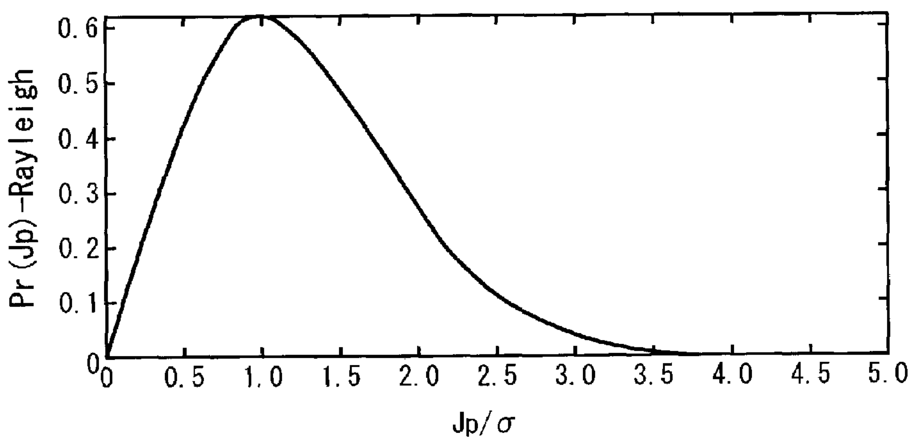
FIG. 9 illustrates Rayleigh probability density function.

(where $\sigma_J$ is a root mean square (RMS) value of clock jitter J[n] and $\sigma_J^2$ is decentralization.) FIG. 9 illustrates a Rayleigh probability density function. In case of $J_p$ is over 0 ($J_p>0$), the Rayleigh probability density function satisfies relation of $P_r(J_p)$ is not equal to 0 ($P_r(J_p)\neq 0$), as shown in FIG. 9.

When peak value $J_p$ is in accordance with Rayleigh distribution, probability where $J_p$ becomes higher than a value of $\hat{J}_{pk}$ is obtained by the following formula.

$$P(J_p > \hat{J}_{pk}) = \int_{\hat{J}_{pk}}^{\infty} P(J_p)\,dJ_p = \exp\left(-\frac{\hat{J}_{pk}^2}{2\sigma_J^2}\right) \tag{2}$$

Standard deviation of $\hat{J}_{pk}$ is obtained by the following formula.

$$\sigma_{J_{pk}} = \sqrt{\frac{4-\pi}{2}}\,\sigma_J \tag{2.1}$$

Figure 10:
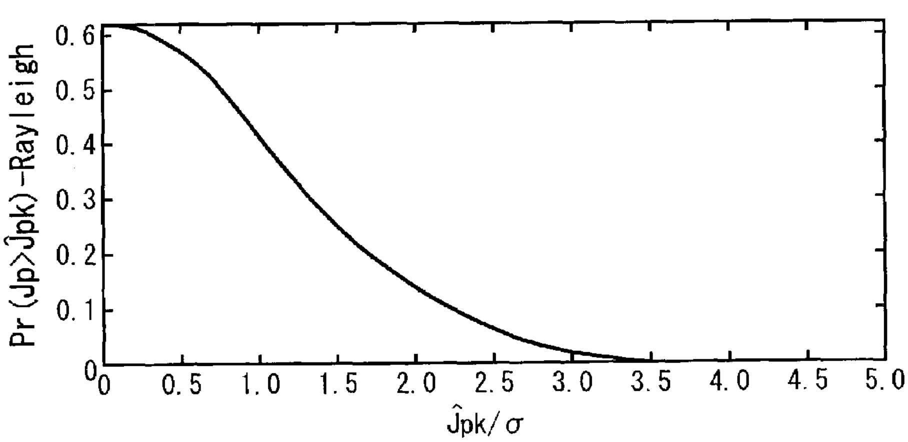
FIG. 10 illustrates probability in which $J_p$ is higher than a value of $\hat{J}_{pk}$.

FIG. 10 illustrates probability where $J_p$ is higher than a value of $\hat{J}_{pk}$.

If $\hat{J}_{pk}$ is set as a worst value of period jitter and root mean $\sigma_J^2$ of period jitter of a tested signal is measured, probability where period jitter of the tested signal exceeds worst value $\hat{J}_{pk}$ can be estimated. And it can be estimated that the smaller the probability is, the higher the reliability of a production process becomes.

Relation shown in a formula (2) can be applied for not only period jitter but also timing jitter and cycle-to-cycle period jitter for example. Cycle-to-cycle period jitter $J_{cc}[n]$ is obtained, for example, based on a difference of period jitter shown by the following formula.

$$J_{cc}[n]=J[n+1]-J[n] \tag{3}$$

When the probability density function of J[n] shows Gaussian distribution, $$P_r(J) = \frac{1}{\sigma\sqrt{2\pi}}\exp\left(-\frac{J^2}{2\sigma^2}\right) \tag{4}$$

the probability density function of $J_{cc}$ is given by its convolution.

$$P_r(J_{cc}) = \int_{-\infty}^{\infty}\sqrt{\frac{1}{\sigma\sqrt{2\pi}}}\exp\left(-\frac{x^2}{2\sigma^2}\right)\exp\left(-\frac{(t-x)^2}{2\sigma^2}\right)dx \tag{5}$$

The probability density function of $J_{cc}$ becomes Gaussian distribution as shown in the following formula based on center limit theorem.

$$P_r(J_{cc}) = \frac{1}{2\sigma\sqrt{\pi}}\exp\left(-\frac{t^2}{4\sigma^2}\right) = \frac{1}{\hat{\sigma}\sqrt{2\pi}}\exp\left(-\frac{Jcc^2}{2\hat{\sigma}^2}\right), \tag{6}$$
$$\hat{\sigma} = \sqrt{2\sigma}$$

Cycle-to-cycle period jitter $J_{cc}[n]$ is a Gaussian random process and its peak value is in accordance with Rayleigh distribution.

Generally, timing jitter is also the Gaussian random process and the peak value of timing jitter is in accordance with Rayleigh distribution. If a low frequency component of timing jitter is excluded, the probability density function of timing jitter closes to Gaussian distribution and hereby estimating precision of probability can be improved.

Figures 1A, 1B, 1C:
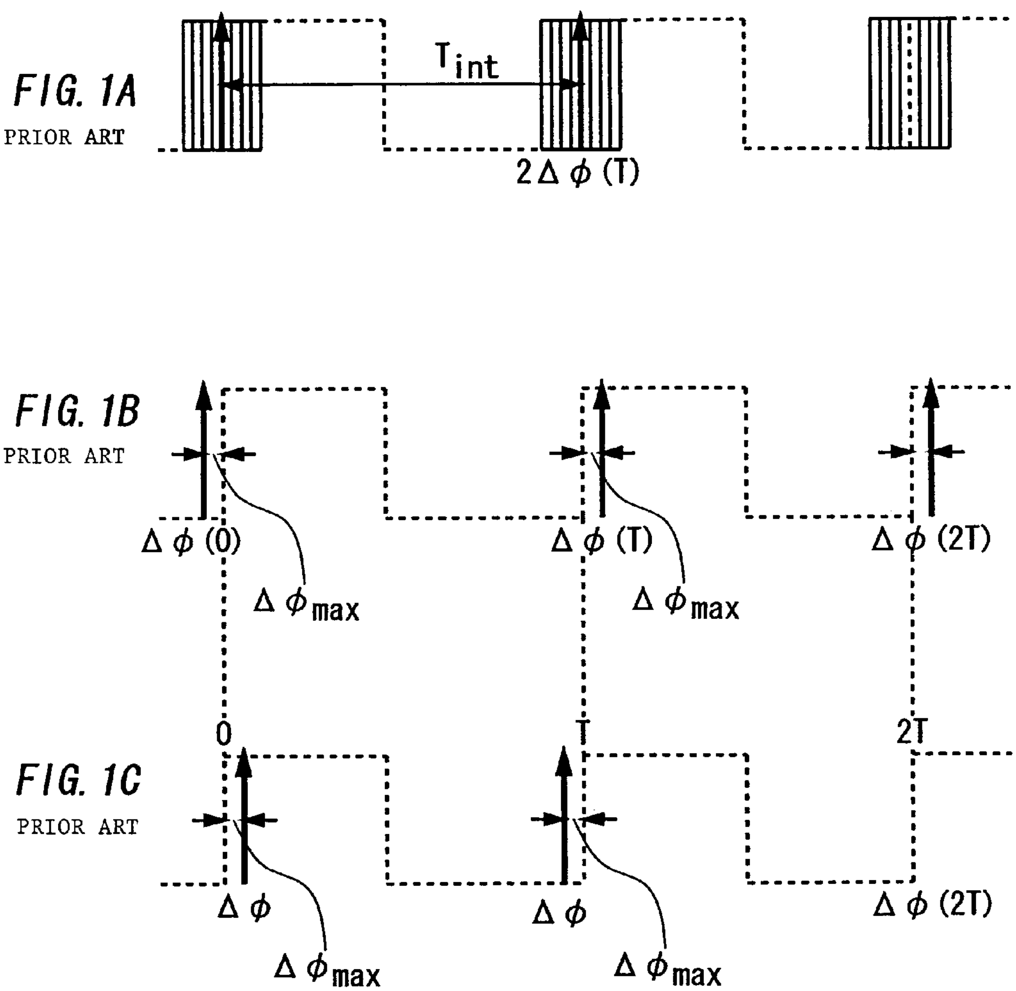
FIGS. 1A to 1C illustrate jitter in a clock signal.
Figure 2:
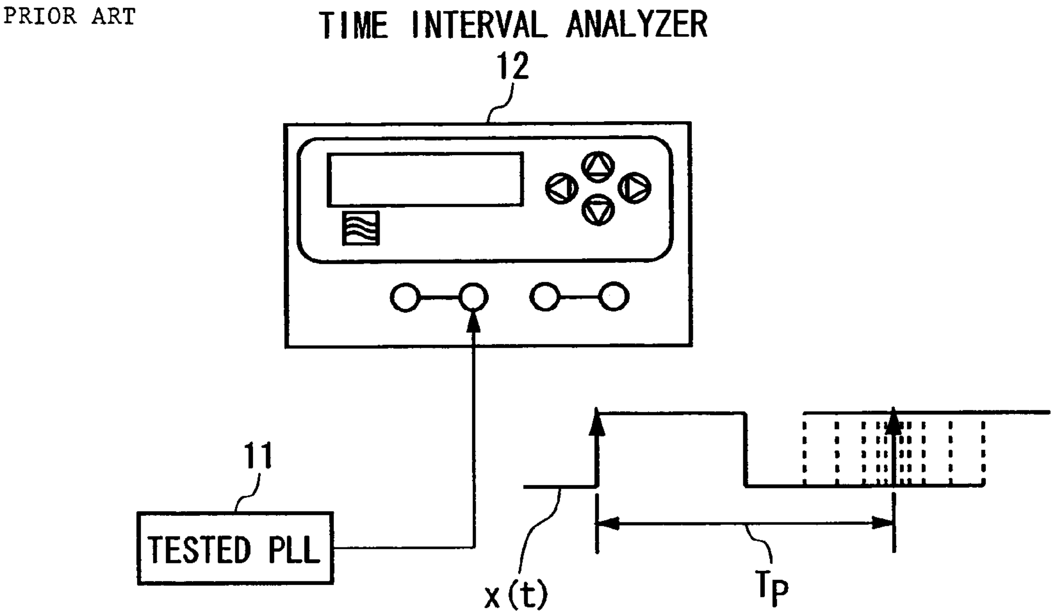
FIG. 2 illustrates a conventional jitter estimating apparatus using a time interval analyzer.
Figure 3:
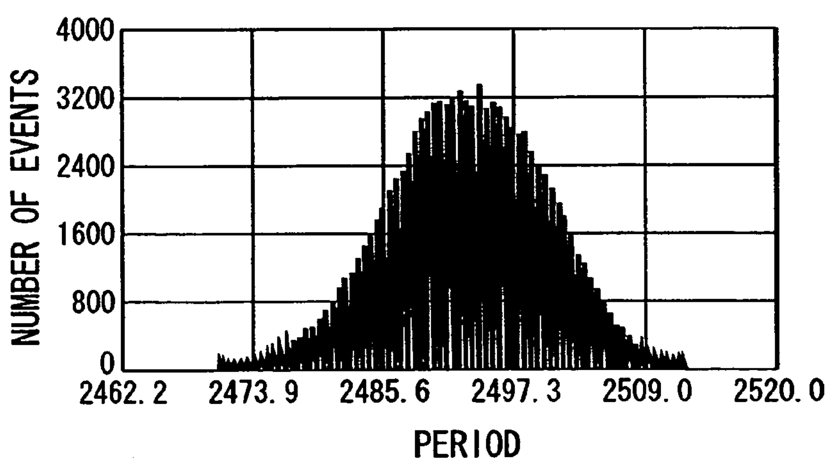
FIG. 3 illustrates histogram of a period measured by the time interval analyzer.
Figure 4:
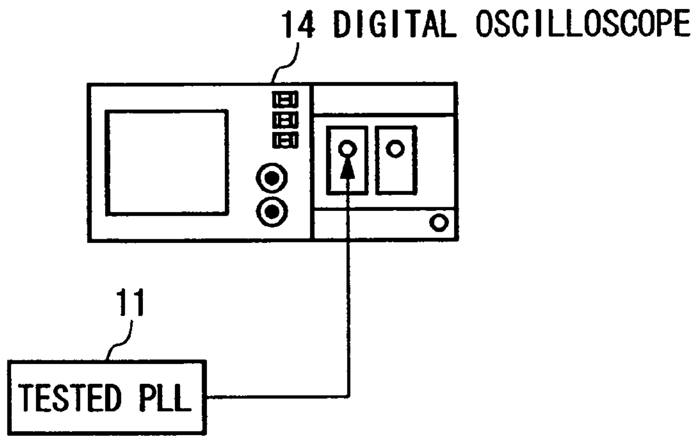
FIG. 4 illustrates a jitter estimating apparatus using a digital oscilloscope.
Figure 5:
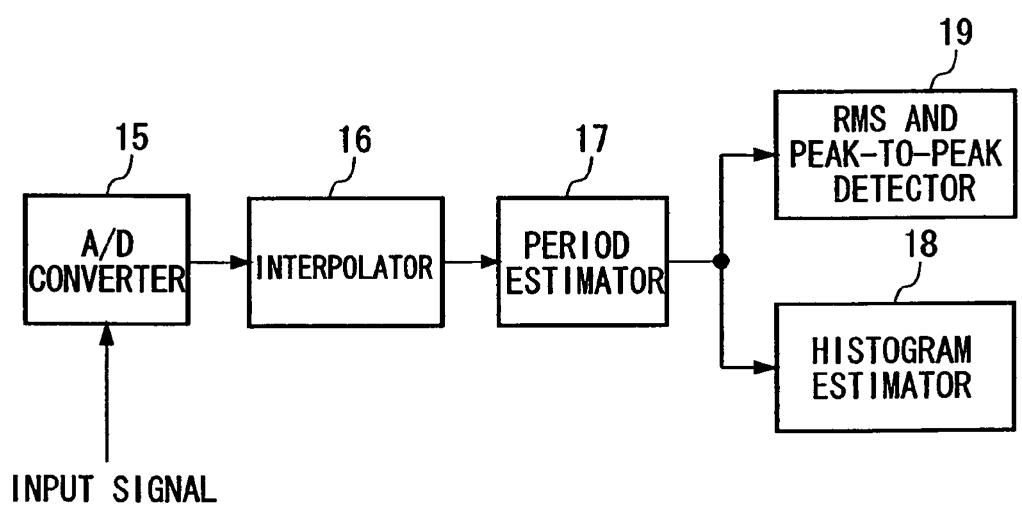
FIG. 5 illustrates components of the jitter measuring apparatus in the digital oscilloscope 14.
Figure 6A:
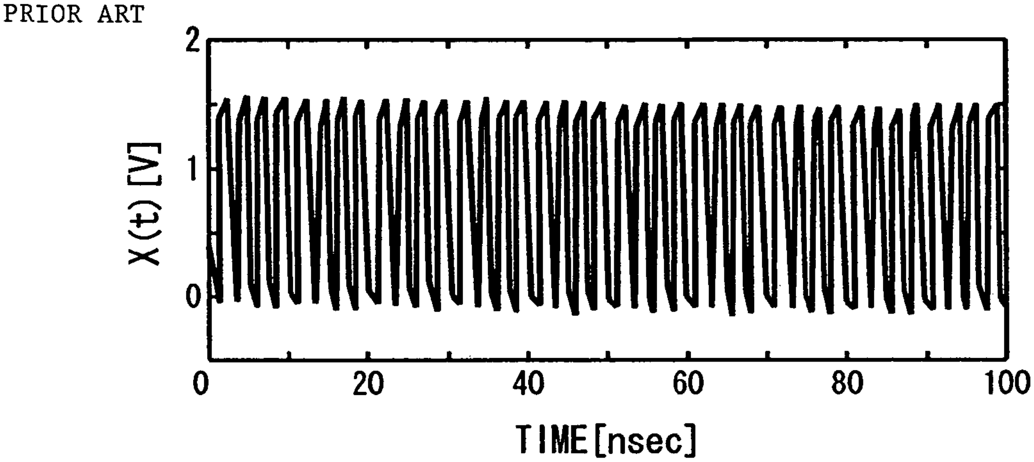
FIGS. 6A and 6B illustrate a tested signal and period jitter measured by the digital oscilloscope.
Figure 6B:
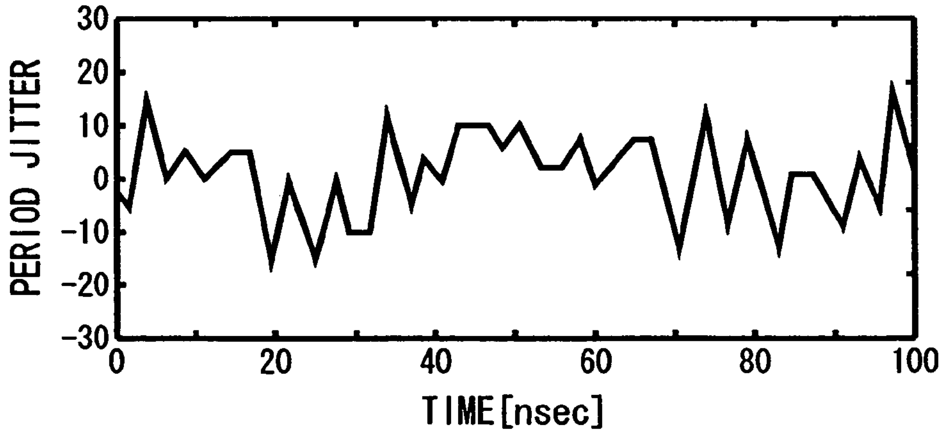

In FIG. 1B, in a case where a rise edge of the clock signal at time 0 rises farthest from an ideal rise point, and then a rise edge of the clock signal at time T delays farthest from the ideal rise point to rise, that is, in a case where timing jitter $\Delta\phi(\mathbf{0})$ of rise edge at time 0 is a maximum value at the negative side, $-\Delta\phi$max, and timing jitter $\Delta\phi(T)$ of rise edge at time T is a maximum value at the positive side, $+\Delta\phi$max, period jitter is a worst peak value in a positive direction.

$$J'^{+}_{p}=\Delta\phi_{max}-(-\Delta\phi_{max})=2\Delta\phi_{max} \tag{7}$$

As shown in FIG. 1C, in a case where timing jitter $\Delta\phi(\mathbf{0})$ of rise edge of the clock signal at time 0 is the maximum value at the positive side, $-\Delta\phi$max, and timing jitter $\Delta\phi(T)$ of rise edge of the clock signal at time T is a maximum value at the positive side, $+\Delta\phi$max, period jitter is the worst peak value in a negative direction.

$$J'^{-}_{p}=-\Delta\phi_{max}-\Delta\phi_{max}=-2\Delta\phi_{max} \tag{8}$$

The maximum value of the peak-to-peak of period jitter, worst value $J'_{pp}$ of period jitter in the clock signal is obtained by the following formula.

$$J'_{pp}=J'^{+}_{p}-J'^{-}_{p}=4\Delta\phi_{max} \tag{9}$$

An absolute value of a maximum value in the positive direction and an absolute value of a maximum value in a negative direction of timing jitters are generally equal.

When probability where peak value $J_p$ of jitter in the tested signal exceeds $\hat{J}_p$ is given by the formula (2), probability where peak-to-peak value $J_{pp}$ of jitter of the tested signal exceeds $\hat{J}_{pp}$ is obtained based on multiplication of probability where positive peak value $J_p^+$ exceeds $+\hat{J}_{pp}/2$ by probability where negative peak value $J_p^-$ exceeds $-\hat{J}_{pp}/2$.

$$\begin{aligned} P_r(J_{pp} > \hat{J}_{pp}) &= P_r\left(J_p^+ > +\frac{\hat{J}_{pp}}{2}\right)\cdot P_r\left(J_p^- > -\frac{\hat{J}_{pp}}{2}\right) \\ &= P_r\left(J_p^+ > \frac{\hat{J}_{pp}}{2}\right)\cdot P_r\left(J_p^- > \frac{\hat{J}_{pp}}{2}\right) \\ &= \exp\left(-\frac{\hat{J}_{pp}^2}{8\sigma_J^2}\right)\exp\left(-\frac{\hat{J}_{pp}^2}{8\sigma_J^2}\right) \\ &= \exp\left(-\frac{\hat{J}_{pp}^2}{4\sigma_J^2}\right) \end{aligned} \tag{10}$$

An embodiment of the present invention to measure jitter based on the above description will be described referring to an example.

Figure 11:
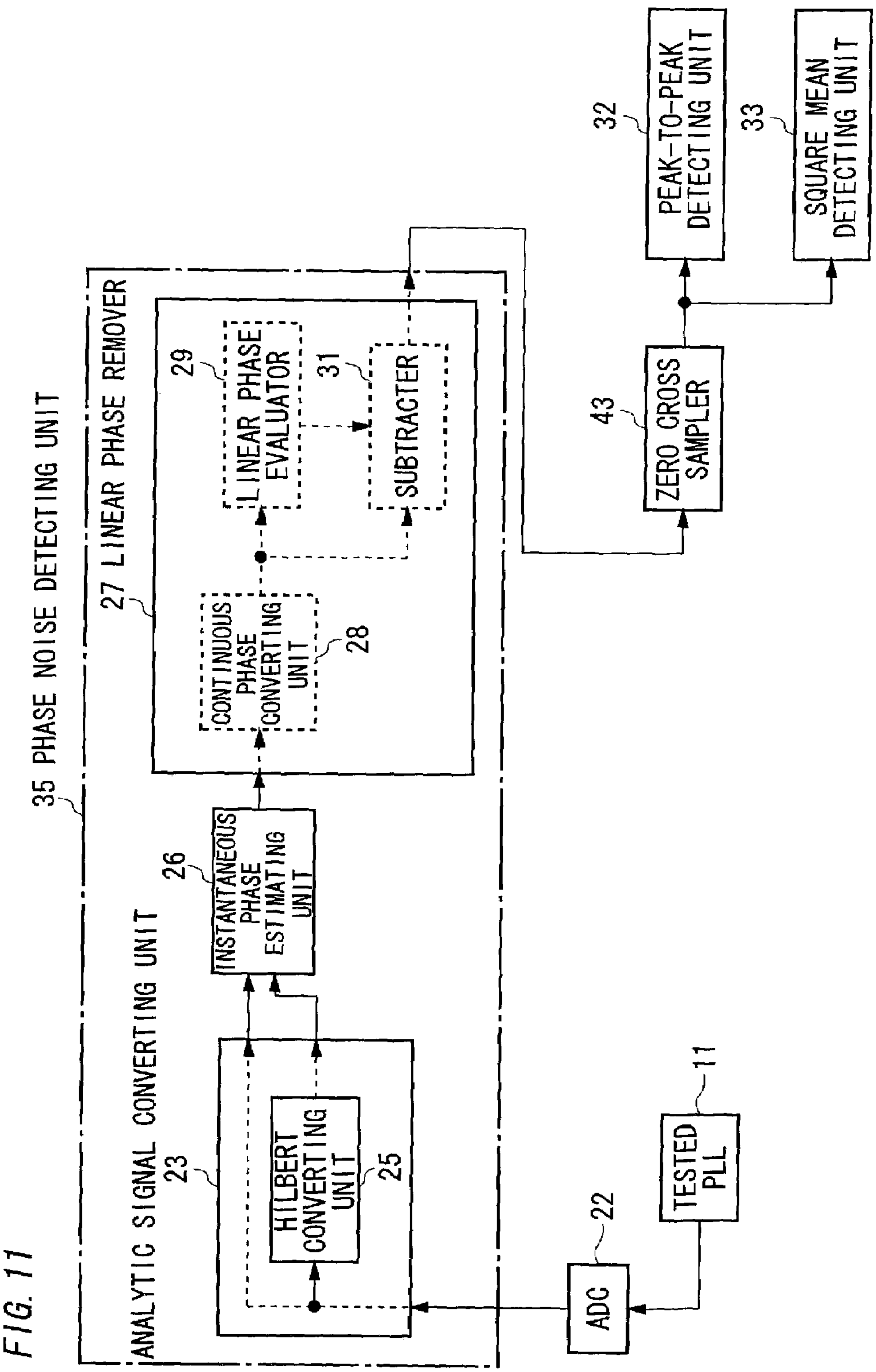
FIG. 11 illustrates one example of a jitter estimating apparatus according to one embodiment in the present invention.

FIG. 11 illustrates one example of a jitter estimating apparatus according to one embodiment in the present invention. A jitter estimating apparatus provides analytic signal converting unit 23, instantaneous phase estimating unit 26, linear phase remover 27, zero cross sampler 43, peak-to-peak detecting unit 32, and square mean detecting unit 33.

A/D converting unit (ADC) 22 receives a tested signal output from tested PLL 11 and converts the received signal into a digital signal. Analytic signal converting unit 23 converts digital tested signal $x_c(t)$ into analytic signal $z_c(t)$ represented by a complex function. In the present embodiment, tested signal $x_c(t)$ is the clock signal and is represented by the following formula.

$$x_c(t)=A_c\cos(2\pi f_c t+\Theta_c-\Delta\phi(t)) \tag{11}$$

$A_c$ is amplitude of the clock signal, $f_c$ is frequency of the tested signal, $\theta_c$ is an initial phase angle, and $\Delta\phi(t)$ is wobbling of a phase (phase noise waveform). In the present embodiment, analytic converting unit 23 is a Hilbert conversion-generator to perform Hilbert conversion for clock signal $x_c(t)$, and has a bandwidth filter (not shown) and Hilbert converting unit 25.

In analytic converting unit 23, the bandwidth filter extracts a signal component around a fundamental frequency of received clock signal $x_c(t)$. Hilbert converting unit 25 performs Hilbert conversion for clock signal $x_c(t)$ by the following formula.

$$\hat{x}_c(t)=H[x_c(t)]=A_c\sin(2\pi f_c t+\Theta_c-\Delta\phi(t)) \tag{12}$$

Analytic signal converting unit 23 outputs analytic signal $z_c(t)$ of which $x_c(t)$ and $\hat{x}_c(t)$ are respectively a real number and an imaginary number.

$$\begin{aligned} z_c(t) &= x_c(t)+\hat{x}_c(t) \\ &= A_c\cos(2\pi f_c t+\Theta_c-\Delta\phi(t))+jA_c\sin(2\pi f_c t+\Theta_c-\Delta\phi(t)) \end{aligned} \tag{13}$$

Instantaneous phase estimating unit 26 estimates instantaneous phase $\theta(t)$ of clock signal $x_c(t)$ by the following formula.

$$\Theta(t)=[2\pi f_c t+\Theta_c-\Delta\phi(t)]\bmod 2\pi_c-\Delta\phi(t)[\text{rad}] \tag{14}$$

Linear phase remover 27 outputs phase noise wave form $\Delta\phi(t)$ by removing a linear phase from instantaneous phase $\theta(t)$. Linear phase remover 27 includes continuous image phase converting unit 28, linear phase evaluator 29, and subtracter 31.

Continuous phase converting unit 28 converts instantaneous phase $\theta(t)$ into continuous phase $\theta(t)$ by an unwrapping method.

$$\theta(t)=2\pi f_c t+\Theta_c-\Delta\phi(t)[\text{rad}] \tag{15}$$

Linear phase evaluator 29 estimates a linear phase of continuous phase $\theta(t)$, that is, a linear instantaneous phase of an ideal signal without jitter. Linear phase evaluator 29 directly conforms by a line-trend estimating method, that is, a minimum square method for received continuous phase $\theta(t)$, and estimates linear instantaneous phase $[2\pi f_c t+\theta_c]$.

Subtracter 31 receives linear instantaneous phase $[2\pi f_c t+\theta_c]$ and continuous phase $\theta(t)$. Subtracter 31 calculates a variance term of instantaneous phase $\theta(t)$, that is, phase noise waveform $\Delta\phi(t)$ by removing continuous phase $\theta(t)$ from linear instantaneous phase $[2f_c t+\theta_c]$.

Zero cross sampler 43 outputs timing jitter sequence $\Delta\phi[n]$, which is set of a randomly sampling value by sampling phase noise waveform $\Delta\phi(t)$. Peak-to-peak detecting unit 32 outputs peak-to-peak value $\Delta\phi_{pp}$ of timing jitter by calculating a difference of a maximum peak value of $\Delta\phi[n]$, $\max(\Delta\phi[k])$ and a minimum peak value of $\Delta\phi[n]$, $\min(\Delta\phi[k])$.

$$\Delta\phi_{RMS}=\sqrt{\frac{1}{N}\sum_{k=0}^{N-1}\Delta\phi^2[n]} \tag{17}$$

Square mean detecting unit 33 receives timing jitter sequence $\Delta\phi[n]$. Square mean detecting unit 33 calculates square mean (RMS) value $\Delta\phi_{RMS}$ of timing jitter by the following formula.

$$\Delta\phi_{pp}=\max_k(\Delta\phi[k])-\min_k(\Delta\phi[k]) \tag{16}$$

As described above, the peak-to-peak value and square mean of timing jitter can be obtained from phase noise wave $\Delta\phi(t)$. A method to obtain the peak-to-peak value and square mean of timing jitter from phase noise wave $\Delta\phi(t)$ is defined as a $\Delta\phi$ method.

The jitter estimating apparatus of the present invention can measure period jitter. Analytic signal z(t) of basic cosine wave x(t) of the tested signal is given by the following formula.

$$\begin{aligned} z(t) &= x(t)+jH[x(t)] \\ &= A\cos(2\pi f_0 t+\theta-\Delta\phi(t))+jA\sin(2\pi f_0 t+\theta-\Delta\phi(t)) \end{aligned} \tag{18}$$

Where $f_0$ is a fundamental frequency of the tested signal and $f_0$ is $1/T_0$. ($T_0$ is a fundamental period). An instantaneous frequency (Hz) of analytic signal z(t) is given by the following formula.

$$\begin{aligned} \frac{1}{T_0+J} &= \frac{\omega(t)}{2\pi}=\frac{1}{2\pi}=\frac{x(t)H'[x(t)]-x'(t)H[x(t)]}{x^2(t)+H^2[x(t)]} \\ &= \frac{1}{T_0}\left(1-\frac{T_0}{2\pi}\Delta\phi'(t)\right) \end{aligned} \tag{19}$$

Therefore, the formula (20) is given as follows:

$$T_0+J(t)\approx T_0\left(1-\frac{T_0}{2\pi}\Delta\phi'(t)\right) \tag{20}$$

Timing jitter sequence is obtained by sampling phase noise waveform $\Delta\phi(t)$ with timing (approximate zero cross point), which is close to each zero cross point of real number part x(t) in analytic signal z(t). In this case, it is preferable that the approximate zero cross point is timing, which is the closest to each zero cross point.

Period jitter J is calculated as difference sequence of the timing jitter sequence by the following formula. In this case, period jitter J may be calculated as sampling interval $T_{k,k+1}$ of the approximate zero cross point is substantially equal to period $T_0$ of the tested signal.

$$J[k] = \frac{\Delta\phi[k+1] - \Delta\phi[k]}{\frac{2\pi}{T_0}} \quad (21)$$

Unit radian is converted into a second by the denominator $2\pi/T_0$.

In case of $T_0 \neq T_{k,k+1}$, period jitter J may be calculated by the following formula.

$$J[k] = \frac{\Delta\phi[k+1] - \Delta\phi[k]}{\frac{2\pi}{T_0}}\left(\frac{T_0}{T_{k,k+1}}\right) \quad (22)$$

$T_0/T_{k,k+1}$ is a correction term for a formula (21).

FIG. 12 illustrates RMS value $J_{RMS}$ and peak-to-peak value $J_{pp}$ of period jitter of the tested signal having sine wave jitter. In this figure, there are shown the period jitters, calculated by the $\Delta\phi$ method using the formula (21), and by a correction $\Delta\phi$ method using the formula (22), that is, the correction term. Period jitter can be calculated precisely by calculating period jitter using the $\Delta\phi$ method. Period jitter can be calculated further precisely by calculating period jitter using a correction $\Delta\phi$ method.

In a case of calculating period jitter, the period may be m period (m=0.5, 1, 2, 3, . . . ). Period jitter may be calculated based on a difference between timing jitter at a prescribed rise (or fall) zero cross point and a next fall (rise) zero cross point of the prescribed rise (fall) zero cross point of the tested signal where m=0.5. Period jitter may be calculated based on a difference between timing jitter at a prescribed rise (or fall) zero cross point and a second rise (fall) zero cross point from the prescribed rise (fall) zero cross point of the tested signal where m=2. RMS detecting unit 33 and peak-to-peak detecting unit 32 respectively calculates RMS value $J_{RMS}$ and peak-to-peak value $J_{pp}$ of period jitter by the following formulas (23) and (24).

$$J_{RMS} = \sqrt{\frac{1}{M}\sum_{k=1}^{M} J^2[k]} \quad (23)$$

$$J_{pp} = \max_k(J[k]) - \min_k(J[k]) \quad (24)$$

(where M is the number of samplings of data constituting calculated period jitter.)

FIG. 13A illustrates histogram of period jitter measured by a time interval analyzer. FIG. 13B illustrates histogram of period jitter measured by the jitter estimating apparatus of the present invention. In these figures, abscissas shows time and ordinates shows the number of events (number of zero cross points).

FIG. 14 illustrates the number of events, RMS value of period jitter, and a peak-to-peak value of period jitter. In FIG. 14, a formula of $J_{pp}$=45 ps is a correct value in approximate number of 5000 events. In FIG. 14, error is calculated by considering 45 ps as a true value. As seen from FIGS. 13A, 13B, and 14, the jitter estimating apparatus of the present invention can calculate jitter of the tested signal with high precision in a short time.

Further, the jitter estimating apparatus of the present invention can also measure cycle-to-cycle period jitter $J_{cc}$. Cycle-to-cycle period jitter $J_{cc}$ is period variance between continuous cycle periods and is represented by the following formula.

$$\begin{aligned} J_{cc}[k] &= T[k+1] - T[k] = (T_0 + J[k+1]) - (T_0 + J[k]) \\ &= J[k+1] - J[k] \end{aligned} \quad (25)$$

A difference of obtained data of period jitter is calculated and square mean of the difference, and a difference between a maximum value and a minimum value are calculated. RMS detecting unit 33 calculates RMS value $J_{cc,RMS}$ of cycle-to-cycle period jitter by the following formula (26).

$$J_{CC,RMS} = \sqrt{\frac{1}{L}\sum_{k=1}^{L} J_{CC}^2[k]} \quad (26)$$

Peak-to-peak detecting unit 32 calculates peak-to-peak value $J_{cc,pp}$ of cycle-to-cycle period jitter by the following formula (27).

$$J_{CC,PP} = \max_k(J_{CC}[k]) - \min_k(J_{CC}[k]) \quad (27)$$

(where L is the number of samplings of data constituting measured cycle-to-cycle period jitter.)

The jitter estimating apparatus of the present invention may calculate timing jitter $\Delta\phi[n]$ by sampling phase noise waveform $\Delta\phi(t)$ in timing close to each zero cross point of real number part x(t) in analytic signal z(t) as aforementioned above, preferably, the timing which is the closest to each zero cross point. Moreover, the jitter estimating apparatus may calculate timing jitter $\Delta\phi[n]$ by further providing an interpolating unit to interpolate data constituting phase noise waveform at each zero cross point by an interpolating method or an inverse interpolating method.

Figure 15:
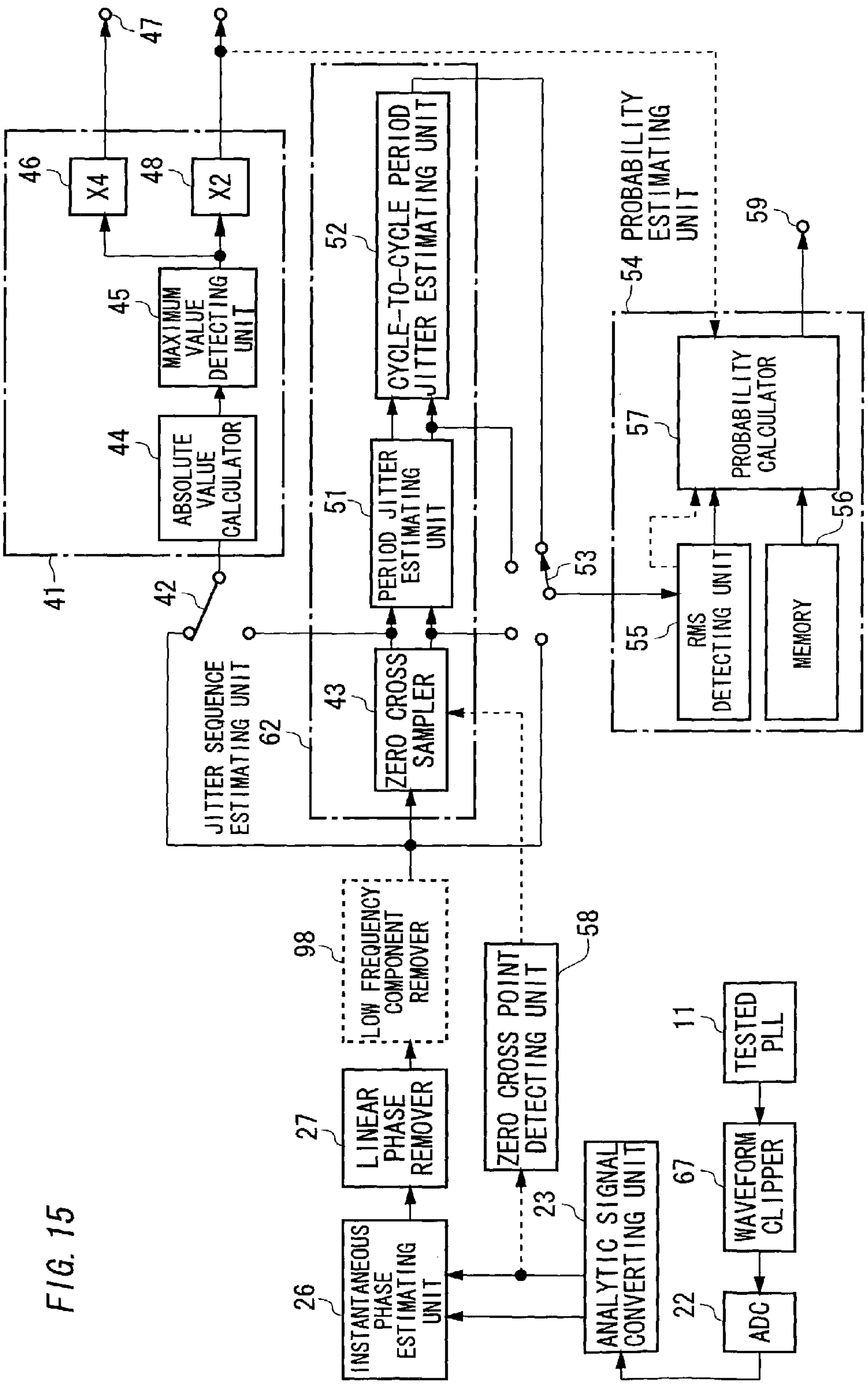
FIG. 15 illustrates another example of the jitter estimating apparatus in the present invention.

FIG. 15 illustrates another example of the jitter estimating apparatus of the present invention. A configuration with the same reference numeral as in FIG. 11 has the same or similar function as/to FIG. 11.

The jitter estimating apparatus has analytic signal converting unit 23, instantaneous phase estimating unit 26, linear phase remover 27, jitter sequence estimating unit 62, worst value estimating unit 41, and probability estimating unit 54. Jitter sequence estimating unit 62 includes zero cross sampler 43, period jitter estimating unit 51, and cycle-to-cycle period jitter estimating unit 52 which are one example of the timing jitter estimating unit. Worst value estimating unit 41 includes absolute value calculator 44, maximum value detecting unit 45, and a constant multiplying means comprising double unit 48 and quadruple unit 46. Probability estimating unit 54 includes RMS detecting unit 55, memory 56, and probability calculator 57. The jitter estimating apparatus in the present embodiment provides switch 42 to switch whether any of linear phase remover 27 and zero cross sampler 43 connects to worst value estimating unit 41, and switch 53 to switch whether any of linear phase mover 27, zero cross sampler 43, period jitter estimating unit 51, and cycle-to-cycle period jitter estimating unit 52 connects to probability estimating unit 54.

Worst value estimating unit 41 receives phase noise waveform $\Delta\phi$ output from linear phase remover 27 or timing jitter sequence $\Delta\phi[n]$ output from zero cross sampler 43. Absolute value calculator 44 calculates an absolute value of received phase noise waveform $\Delta\phi(t)$ or an absolute value of timing jitter sequence $\Delta\phi[n]$ in worst value estimating unit 41. Since phase noise wave $\Delta\phi(t)$ and timing jitter sequence $\Delta\phi[n]$ are digital data, all of sign bits are converted into positive values in absolute value calculator 44.

Maximum value detecting unit 45 detects an absolute maximum value (peak value) of phase noise waveform $\Delta\phi(t)$ or an absolute maximum value of timing jitter sequence $\Delta\phi[n]$. That is, maximum value detecting unit 45 detects maximum value $\Delta\phi max$ of timing jitter described in FIG. 1B. Quadruple unit 46 calculates worst value $\hat{J}_{pp}$ of period jitter in the tested signal by quadrupling maximum value $\Delta\phi max$ of timing jitter and the calculated value is output to output terminal 47.

$$\hat{J}_{pp}=4\Delta\phi max$$

Double unit 48 may output worst value $\hat{J}_{pp}$ of period jitter in the tested signal by doubling maximum value $\Delta\phi max$ of timing jitter. The constant multiplying means may have a means to calculate a peak value of the tested signal and/or a worst value of the peak-to-peak value by multiplying a received maximum value by approximate integer.

A positive maximum peak and a negative maximum peak of period jitter have to be obtained before the maximum value of the peak-to-peak value, i.e., worst value $\hat{J}_{pp}$ of period jitter is calculated for the first time according to a conventional time interval analyzer method. Thereby, an extremely long time to calculate the worst value is required. However, since the jitter estimating apparatus in the present embodiment can estimate period jitter of the tested signal by providing worst estimating unit 41 when maximum value $\Delta\phi max$ of timing jitter of the tested signal is obtained, the jitter estimating apparatus can estimate worst value $\hat{J}_{pp}$ of period jitter in an extremely short time.

The jitter estimating apparatus of the present embodiment can estimate probability in which the peak-to-peak value of each jitter of the tested signal exceeds a prescribed value. In this case, zero cross sampler 43 outputs a prescribed sample value sequence and a sample value sequence one-delayed from the prescribed sample value of the tested signal. Period jitter estimating unit 51 receives the prescribed sample value sequence and the one-delayed sample value sequence, and then outputs the prescribed period jitter sequence and the one-delayed period jitter sequence.

Switch 53 switches whether any of linear phase mover 27, zero cross sampler 43, period jitter estimating unit 51, and cycle-to-cycle period jitter estimating unit 52 connects to probability estimating unit 54.

Memory 56 stores a set value to compare with the peak-to-peak value to calculate probability in which the peak-to-peak value of each jitter of the tested signal exceeds the prescribed value. In the present embodiment, memory 56 stores set values $\Delta\phi_k$, $\Delta\phi_{pk}$, $\hat{J}_{pk}$, and $\hat{J}_{cc,pp}$ to calculate probability in which each peak-to-peak value of phase noise waveform $\Delta\phi(t)$, timing jitter, period jitter and cycle-to-cycle period jitter of the tested signal exceeds a prescribed value. The set value stored in memory 56 may freely be set by a measurer according to jitter to be measured in the tested signal. An operation that the jitter estimating apparatus estimates probability in which the peak-to-peak value of each jitter of the tested signal exceeds the prescribed value will be described below.

An operation to calculate probability in which the peak-to-peak value of phase noise waveform $\Delta\phi(t)$ of the tested signal exceeds set value $\Delta\phi_k$ is described. When probability in which the peak-to-peak value of phase noise waveform $\Delta\phi(t)$ exceeds set value $\Delta\phi_k$ is calculated, switch 53 connects linear phase remover 27 to probability estimating unit 54. RMS detecting unit 55 receives phase noise waveform $\Delta\phi(t)$ output by linear phase remover 27 in probability estimating unit 54. RMS detecting unit 55 calculates RMS value $\Delta\phi_{RMS}$ of phase noise in the tested signal based on a formula (17).

Probability calculator 57 reads set value $\Delta\phi_k$ stored in memory 56. Probability calculator 57 receives RMS value $\Delta\phi_{RMS}$ of phase noise of the tested signal. Probability calculator 57 calculates probability $P_r(\Delta\phi_{pp}>\Delta\phi_k)$ in which peak-to-peak value $\Delta\phi_{pp}$ of phase noise waveform $\Delta\phi(t)$ of the tested signal exceeds set value $\Delta\phi_k$ from RMS value $\Delta\phi_{RMS}$ and set value $\Delta\phi_k$ based on the formula (10). In this case, probability is calculated under a condition of which $\Delta\phi_{RMS}$ is substituted for $\sigma_J$ and $\Delta\phi_k$ is substituted for $\hat{J}_{pp}$ in the formula (10). Probability calculator 57 outputs calculated probability $P_r(\Delta\phi_{pp}>\Delta\phi_k)$ to output terminal 59.

FIGS. 16A to 16B illustrate real number part $x_c(t)$ of analytic signal $z_c(t)$, phase noise waveform $\Delta\phi(t)$, and period jitter $J_p(t)$. An operation to calculate probability in which the peak-to-peak value of timing jitter in the tested signal exceeds set value $\Delta\phi_{pk}$ will be described referring to FIGS. 15 and 16A to 16C.

Zero cross point detecting unit 58, provided between analytic signal converting unit 23 and zero cross sampler 43, detects a sample point (calculation point) which is close to a zero cross point of real number part $x_c(t)$ in analytic signal $z_c(t)$ output from analytic signal converting unit 23. In this case, the zero cross detecting unit preferably detects the sample point which is the closest to the zero cross point of real number $x_c(t)$.

FIG. 16A illustrates one example of the sample point which is the closest to the zero cross point of real number part $x_c(t)$ detected by zero cross point detecting unit 58. The sample point which is the closest to a detected zero cross point is shown with a circular mark and the sample point is an approximate zero cross point, in FIG. 16A.

One example of an operation that zero cross point detecting unit 58 detects the approximate zero cross point is described. Level V (50%) of 50% of the maximum value and the minimum value is calculated as a level of zero cross in a case where a maximum value of waveform of real number part $x_c(t)$ in the analytic signal is a level of 100% and a minimum value is a level of 0%. Differences, $(x_c(j\text{-}1)-V(50\%))$ and $(x_c(j)-V(50\%))$, of each adjacent sample value ((j-1)-th value, j-th value) in sampling values of real number part $x_c(t)$ and the level V of 50% are calculated, and these multiplied values are further calculated.

$$(x_c(j-1)-V(50\%))\times(x_c(j)-V(50\%))$$

In a case where $x_c(t)$ crosses a level of 50%, that is, a zero level, between (j-1)-th value and j-th value, sign of a (j-1)-th sample value $(x_c(j\text{-}1)-V(50\%))$ or a j-th sample value $(x_c(j)-V(50\%))$ changes from a negative to a positive or from the positive to the negative. The sign of multiplied value is changed to the negative when $x_c(t)$ crosses the zero level. Zero cross point detecting unit 58 outputs either of j-1-th sample value ($x_c$(j-1)−V(50%)) or j-th sample value ($x_c$(j)−V(50%)), which has the smaller absolute value of the two, as the approximate zero cross point, in the case where $x_c(t)$ crosses a level of 50%, that is, a zero level, between (j-1)-th value and j-th value. Zero cross point detecting unit 58 outputs timing in which the calculated approximate zero cross point is sampled.

Zero cross sampler 43 receives timing of the approximate zero cross point from zero cross point detecting unit 58. Zero cross sampler 43 samples phase noise waveform $\Delta\phi(t)$ output by linear phase remover 27 based on timing of the received approximate zero cross point, that is, timing shown by the circular mark in FIG. 16B. The sample value of phase noise waveform $\Delta\phi(t)$ sampled by zero cross sampler 43 shows shift amount out of ideal zero cross timing of real number part $x_c(t)$ in the analytic signal without jitter, that is, timing jitter.

In a case where probability in which the peak-to-peak value of timing jitter exceeds set value $\Delta\phi_{pk}$ is calculated, switch 53 connects zero cross sampler 43 to probability estimating unit 54. Probability estimating unit 54 receives a sample value output from zero cross sampler 43.

RMS detecting unit 55 receives a sample value sequence, which is set of randomly sample value output from zero cross sampler 43, that is, timing jitter sequence in probability estimating unit 54. RMS detecting unit 55 calculates RMS value $\Delta\phi_{RMS}$ of timing jitter of a tested signal from timing jitter sequence based on the formula (17).

Probability calculator 57 reads set value $\Delta\phi_{pk}$ stored in memory 56. Probability calculator 57 receives RMS value $\Delta\phi_{RMS}$ of timing jitter of the tested signal. Probability calculator 57 calculates probability $P_r(\Delta\phi_{pp}>\Delta\phi_{pk})$ in which peak-to-peak value $\Delta\phi_{pp}$ of timing jitter $\Delta\phi[k]$ of the tested signal exceeds set value $\Delta\phi_{pk}$ from RMS value $\Delta\phi_{RMS}$ and set value $\Delta\phi_{pk}$ based on the formula (10). In this case, probability is calculated under a condition of which $\Delta\phi_{RMS}$ is substituted for $\sigma$ and $\Delta\phi_{pk}$ is substituted for $\hat{J}_{pp}$ in the formula (10). Probability calculator 57 outputs calculated probability $P_r(\Delta\phi_{pp}>\Delta\phi_{pk})$ to output terminal 59.

An operation to calculate probability in which the peak-to-peak value of period jitter J of the tested signal exceeds the set value $\hat{J}_{pk}$ will be described referring to FIG. 15 and FIGS. 16A to 16C.

Period jitter estimating unit 51 receives two sequences. Period jitter estimating unit 51 calculates wobbling between zero cross points, that is, period jitter $J_p$ by calculating a difference between timing jitter in prescribed timing and timing jitter in next timing of prescribed timing with respect to each timing jitter $\Delta\phi[k]$. For example, period jitter estimating unit 51 calculates a difference $\Delta\phi_{n+1}-\Delta\phi_n$ between n-th sample value $\Delta\phi_n$ and (n+1)-th sample value $\Delta\phi_{n+1}$ of $\Delta\phi(t)$ as period jitter $J_p$ as shown in FIG. 16B. By this way, period jitter estimating unit 51 calculates sequence of period jitter $J_p$ as shown in FIG. 16C by sequentially calculating period jitter $J_p$ and outputs the calculated value.

In a case where probability in which the peak-to-peak value of period jitter exceeds set value $\hat{J}_{pk}$ is calculated, switch 53 connects period jitter estimating unit 51 to probability estimating unit 54. Probability estimating unit 54 receives period jitter $J_p$ or period jitter sequence J[k] output from period jitter estimating unit 51. RMS detecting unit 55 calculates RMS value $J_{RMS}$ of period jitter of the tested signal from period jitter sequence based on the following formula or the formula (23).

$$J_{RMS}=\sigma_J=\sqrt{\frac{1}{N}\sum_{n=0}^{N-1}J_p^2(n)} \tag{28}$$

Probability calculator 57 reads set value $\hat{J}_{pk}$ stored in memory 56. Probability calculator 57 receives RMS value $J_{RMS}$ of period jitter of the tested signal. Probability calculator 57 calculates probability $P_r(J_{pp}>\hat{J}_{pk})$ in which peak-to-peak value $J_{pp}$ of period jitter J[k] of the tested signal exceeds setting value $\hat{J}_{pk}$ from RMS value $J_{RMS}$ and set value $\hat{J}_{pk}$ based on the formula (10). In this case, probability is calculated under a condition of which $J_{RMS}$ is substituted for $\sigma_J$ and $\hat{J}_{pk}$ is substituted for $\hat{J}_{pp}$ in the formula (10). Probability calculator 57 outputs calculated probability $P_r(J_{pp}>\hat{J}_{pk})$ to output terminal 59.

In another embodiment, probability estimating unit 54 may receive output of worst value estimating unit 41 and estimate probability. In this case, probability calculator 57 receives RMS value $\sigma_J$ of period jitter and $\hat{J}_{pk}=2\Delta\phi\max$ calculated in double unit 48. Probability calculator 57 calculates probability $P_r(J_p>\hat{J}_{pk})$ in which peak value $J_p$ of period jitter of the tested signal exceeds set value $\hat{J}_{pk}$ by the formula (2), that is, the following formula.

$$P_r(J_p>\hat{J}_{pk})=\exp\left(-\frac{\hat{J}_{pk}^2}{2\sigma_J^2}\right)$$

Probability calculator 57 outputs probability $P_r(J_p>\hat{J}_{pk})$ in which peak value $J_p$ of period jitter of the tested signal exceeds set value $\hat{J}_{pk}$ to output terminal 59. Probability calculator 57 may receive RMS value $\sigma_J$ of period jitter and $\hat{J}_{pk}=4\Delta\phi\max$ calculated in quadruple unit 46, calculate probability $P_r(J_{pp}>\hat{J}_{pk})$ in which peak-to-peak value $J_{pp}$ of period jitter of the tested signal exceeds set value $\hat{J}_{pk}$ based on the formula (10), and output the calculated value to output terminal 59.

FIG. 17 illustrates a configuration of period jitter estimating unit 51. Period jitter estimating unit 51 includes interval calculator 51*a*, calculator 51*b*, correction unit 51*c*, and delay unit 51*d*. Interval calculator 51*a* receives a zero cross sample pulse from zero cross point detecting unit 58. Interval calculator 51*a* calculates an interval between edges of each zero cross sample pulses which are adjacent to each other, for example, interval $T_{k\cdot k+1}$ between k-th edge and (k+1)-th edge.

Calculator 51*b* receives timing jitters of edges which are adjacent to each other in the tested signal, for example, k-th timing jitter $\Delta\phi[k]$ and (k+1)-th timing jitter $\Delta\phi[k+1]$ from zero cross sampler 43. Calculator 5*b* calculates period jitter sequence J[k] by the formula (21). Calculator 51*b* converts a unit of period jitter sequence J[k]by multiplying calculated period jitter sequence J[k] by $T_0/2\pi$.

Correcting unit 51*c* receives interval $T_{k\cdot k+1}$ calculated in interval calculator 51*a* and period jitter sequence J[k] calculated in calculator 51*b*. Correcting unit 51*c* calculates period jitter sequence J[k] corrected by multiplying period jitter sequence by correct term $T_0/T_{k\cdot k+1}$ based on the formula (22). Period jitter sequence J[k] calculated in correcting unit 51*c* is output from period jitter estimating unit 51 and is supplied to delay unit 51*d*. Delay unit 51*d* delays received period jitter sequence J[k] for one period to output delayed period jitter sequence J[k].

Probability in which peak-to-peak value $J_{pp}$ of period jitter exceeds set value $\hat{J}_{pk}$ can be calculated precisely by providing correcting unit 51*c* to calculate period jitter sequence J[k] by the formula (22), that is, by using correct term.

An operation to calculate probability in which peak-to-peak value $J_{cc,pk}$ of cycle-to-cycle period jitter $J_{cc}$ of the tested signal exceeds set value $\hat{J}_{cc,pk}$ will be described. Cycle-to-cycle period jitter estimating unit 52 sequentially receives adjacent period jitter J[k] and J[k+1] calculated in period jitter estimating unit 51. Cycle-to-cycle period jitter estimating unit 52 calculates different value $J_{cc}[k]$ between adjacent jitters by the formula (25).

$$J_{cc}[k]=J[k+1]-J[k]$$

Cycle-to-cycle period jitter estimating unit 52 outputs cycle-to-cycle sequence $J_{cc}[k]$.

In a case where probability in which peak-to-peak value $J_{cc,pk}$ of cycle-to-cycle period jitter $J_{cc}$ exceeds set value $\hat{J}_{cc,pk}$ is calculated, switch 53 connects cycle-to-cycle period jitter estimating unit 52 to probability estimating unit 54. Probability estimating unit 54 receives cycle-to-cycle jitter sequence $J_{cc}[k]$ output from cycle-to-cycle period jitter estimating unit 52.

RMS detecting unit 55 calculates RMS value $J_{cc,RMS}$ of cycle-to-cycle period jitter of the tested signal from cycle-to-cycle jitter sequence $J_{cc}[k]$ based on the formula (26).

Probability calculator 57 reads set value $\hat{J}_{cc,pk}$ stored in memory 56. Probability calculator 57 receives RMS value $J_{cc,RMS}$ of period jitter of the tested signal. Probability calculator 57 calculates probability $P_r(J_{cc,pp}>\hat{J}_{cc,pk})$ in which peak-to-peak value $J_{cc,pp}$ of cycle-to-cycle period jitter $J_{cc}[k]$ of the tested signal exceeds $\hat{J}_{cc,pk}$ from RMS value $J_{cc,RMS}$ and set value $\hat{J}_{cc,pk}$ based on the formula (10). In this case, probability is calculated under a condition of which $J_{cc,RMS}$ is substituted for $\sigma_J$ and $\hat{J}_{cc,pk}$ is substituted for $\hat{J}_{pp}$ in the formula (10). Probability calculator 57 outputs calculated probability $P_r(J_{cc,pp}>\hat{J}_{cc,pk})$ to output terminal 59.

In the jitter estimating apparatus of this embodiment, memory 56 may store various set values to calculate probability in which the peak value of jitter exceeds the prescribed value. In this case, probability calculator 57 reads a desired set value from memory 56 according to various jitters to be measured and calculates probability in which the peak value of jitter exceeds the set value based on the formula (2).

In a case where probability in which the peak-to-peak value of various jitter exceeds the set value is calculated, probability estimating unit 54 may further have a constant multiplying means to multiply RMS value of various jitter, which is calculated by RMS detecting unit 55, by 2K (K is positive constant). In this case, probability calculator 57 receives a value calculated by the constant multiplying means as set value $\hat{J}_{pk}$ and calculates probability in which the peak-to-peak value of various jitter exceeds the set value by the formula (10).

In a case where probability in which the peak value of various jitter exceeds the set value is calculated, probability estimating unit 54 may further have a constant multiplying means to multiply RMS value of various jitter, which is calculated by RMS detecting unit 55, by K (K is positive constant). In this case, probability calculator 57 receives the value calculated by the constant multiplying means as set value $\hat{J}_{pk}$ and calculates probability in which the peak-to-peak value of various jitter exceeds the set value based on the formula (10).

The jitter estimating apparatus may further provide waveform clipper 67. Waveform clipper 67 receives the tested signal output from tested PLL 11, shapes signal waveform of the tested signal, and supplies the shaped tested signal to ADC 22. The jitter estimating apparatus can keep amplitude of the tested signal substantially constant by providing waveform clipper 67. Influence on phase noise waveform $\Delta\phi(t)$ can be reduced greatly by amplitude modulation. Jitter can be measured more precisely. In another example, ADC 22 may perform a process similar to a process of waveform clipper 67.

The jitter estimating apparatus may further provide low frequency component remover 98 for receiving phase noise waveform $\Delta\phi(t)$ to remove the low frequency component from phase noise waveform $\Delta\phi(t)$. In this case, switch 42 preferably connects either low frequency component remover 98 or zero cross sampler 43 to worst value estimating unit 41. Switch 53 preferably connects either low frequency component remover 98, zero cross sampler 43, period jitter estimating unit 51 or the cycle-to-cycle period jitter estimating unit to probability estimating unit 54. The jitter estimating apparatus can remove low frequency component sufficiently lower than frequency of tested signal $x_c(t)$ by providing low frequency component remover 98. It is possible to prevent overestimating peak-to-peak jitter.

Figure 18A:
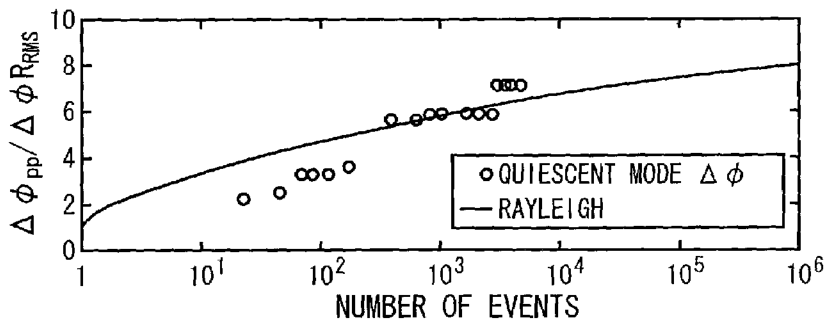
FIGS. 18A and 18B illustrate relation of peak-to-peak value $\Delta\phi_{pp}$ of timing jitter $\Delta\phi$ in the clock signal (tested signal), output by the microprocessor, measured with the jitter estimating apparatus in the present invention, to the number of events.
Figure 18B:
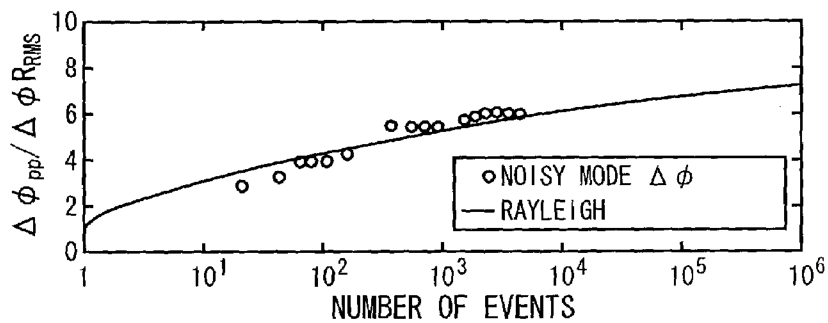

FIGS. 18A and 18B illustrate relationship between peak-to-peak value of timing jitter $\Delta\phi$ in the clock signal (tested signal) and the number of event, the clock signal being output by the microprocessor and estimated by the jitter estimating apparatus of the present invention. FIG. 18A illustrates a case of a quiescent mode and FIG. 18B illustrates a case of a noisy mode. An ordinate axis shows peak-to-peak value $\Delta\phi_{pp}$ and an abscissas axis shows the number of events.

Solid line shows theoretical curve of timing jitter and a circular mark shows timing jitter estimated by the jitter estimating apparatus of the present invention in FIGS. 18A and 18B. FIGS. 18A and 18B describe that the jitter estimating apparatus of the present invention can precisely estimate jitter. Practically, since jitter in the noisy mode specially becomes a problem in a case where a microprocessor is used, it is preferable that jitter can be estimated precisely in the noisy mode. The jitter estimating apparatus in the present invention can estimate generation probability of timing jitter extreme precisely even when the microprocessor operates in the noisy mode.

Figure 19A:
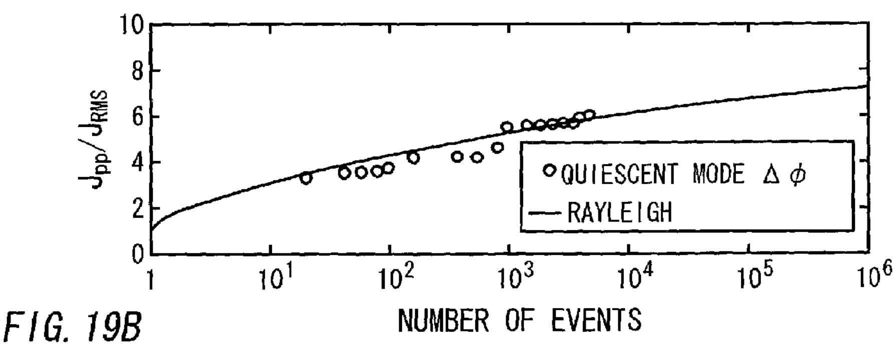
FIGS. 19A and 19B illustrate relation of peak-to-peak value $J_{pp}$ of period jitter $J_p$ in the clock signal (tested signal) output by the microprocessor, measured with the jitter estimating apparatus in the present invention, to the number of events.
Figure 19B:
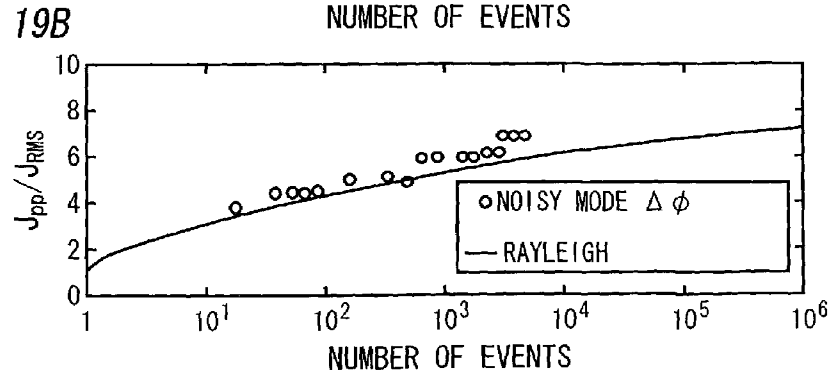

FIGS. 19A and 19B illustrate relationship between peak-to-peak value of period jitter $J_p$ in the clock signal (tested signal) and the number of event, the clock signal being output by the microprocessor and estimated by the jitter estimating apparatus of the present invention. FIG. 19A illustrates the case of quiescent mode and FIG. 19B illustrates the case of noisy mode. The ordinate axis shows peak-to-peak value $J_{pp}$ and the abscissa axis shows the number of events.

Solid line shows theoretical curve of period jitter and the circular mark shows period jitter estimated by the jitter estimating apparatus of the present invention in FIGS. 19A and 19B. FIGS. 19A and 19B describe that the jitter estimating apparatus of the present invention can precisely estimate generation probability of period jitter.

Figure 20A:
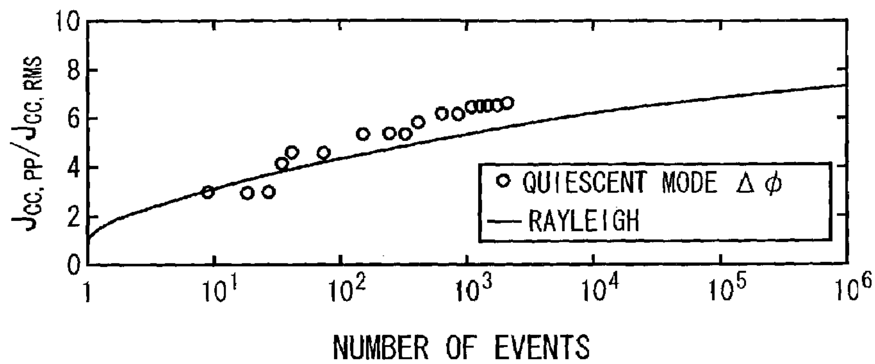
FIGS. 20A and 20B illustrate relation of peak-to-peak value $J_{cc,pp}$ of cycle-to-cycle period jitter $J_{cc}$ in the clock signal (tested signal), output by the microprocessor, measured with the jitter estimating apparatus in the present invention, to the number of events.
Figure 20B:
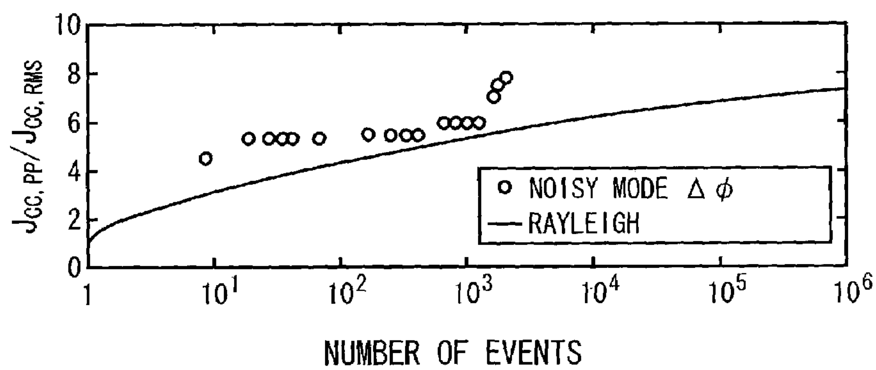

FIGS. 20A and 20B illustrate relationship between peak-to-peak value of cycle-to-cycle period jitter $J_p$ in the clock signal (tested signal) and the number of event, the clock signal being output by the microprocessor and estimated by the jitter estimating apparatus of the present invention. FIG. 20A illustrates the case of quiescent mode and FIG. 20B illustrates the case of noisy mode. The ordinate axis shows peak-to-peak value $J_{pp}$ and the abscissa axis shows the number of events.

Solid line shows the theoretical curve of period jitter and the circular mark shows period jitter estimated by the jitter estimating apparatus of the present invention in FIGS. 20A and 20B. FIGS. 20A and 20B describe that the jitter estimating apparatus of the present invention can precisely estimate generation probability of cycle-to-cycle period jitter.

Figures 21, 22:
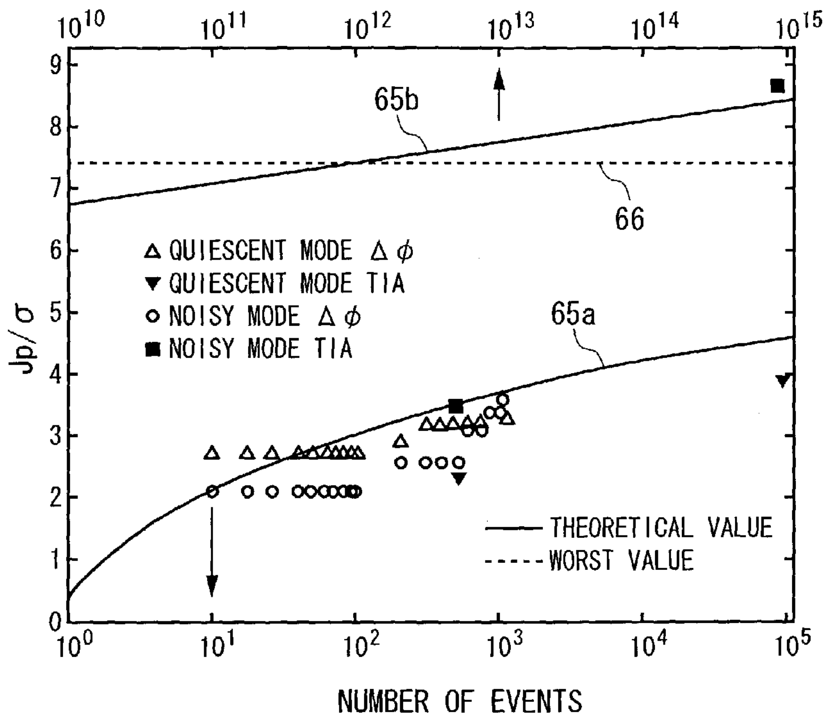
FIG. 21 illustrates the number of zero cross points needed for estimating a peak value of period jitter.
FIG. 22 illustrates measured values of jitter measured by the time interval analyzer and a $\Delta\phi$ method.

FIG. 21 illustrates zero cross points number to estimate period jitter. Curves 65*a* and 65*b* show a theoretical value calculated from reciprocal of probability calculated by the formula (2). A lower abscissa axis shows the zero cross point number of curve 65*a* and an upper abscissa axis shows the zero cross point number of curve 65*b*. A Δ mark shows the peak value of period jitter in the quiescent mode calculated by a Δϕ method and a ▼ mark shows the peak value of period jitter in the quiescent mode calculated by the time interval analyzer. The ○ mark shows the peak value of period jitter in the noisy mode calculated by the Δϕ method and a ■ mark shows the peak value of period jitter in the noisy mode calculated by the time interval analyzer. The Δϕ method makes 4Δϕmax to be the worst value $J'_{pp}$ and broken line 66 shows the value of $J'_{pp}/2\sigma_J$.

The peak value of period jitter calculated by the Δϕ method is almost consistent with the theoretical value and it can be seen that the peak value of period jitter is accordance with Rayleigh distribution. According to the time interval analyzer, the worst value of period jitter is obtained at a point of zero cross point number of $10^5$ in only noisy mode. However, according to the Δϕ method in the present invention, it can be seen that a measured value is consistent with curve 65*a*, which is the theoretical value, around the point of zero cross point number of $10^3$. The worst value of period jitter in the case is shown by broken line 66.

According to a conventional time interval analyzer method, a zero cross point number of $10^5$ is needed to calculate the worst value of period jitter even in the noisy mode, however, only a zero cross point number of $10^3$ is needed by the Δϕ method in the present invention. Jitter of the tested signal can be estimated in an extreme short time.

FIG. 22 illustrates measured values of jitter measured by the time interval analyzer and the Δϕ method. FIG. 22 illustrates peak-to-peak value $J_{pp}$ by the time interval analyzer method, as well as timing jitter peak value $\Delta\phi_p$, worst value $J_{pp}$ of the period jitter, and probability $P_r(J_p)$ by a Δϕ method of the present invention, in the quiescent mode and in the noisy mode and the number of zero cross points used for measurement. Regarding the value of the Δϕ method, the values of the two cases are shown, e.g., a case where amplitude modulation does not occur in the tested signal in which phase modulation by jitter occurs (PM) and a case where amplitude modulation occurs (PM+AM)

A maximum value (worst value) of peak-to-peak of period jitter can be calculated by 997 zero cross points according to the Δϕ method, in contrast, it can be seen that 102000 zero cross points is needed by the conventional time interval analyzer method. In the time interval analyzer method, values of $J_{pp}$ are greatly different between a case where a number of zero cross points is 500 and a case where a number of zero cross points is 102000, and values of $J_{pp}$ cannot be measured in the case where a number of zero cross points is 500, correctly. The jitter estimating apparatus by the Δϕ method in the present invention can estimate jitter further precisely in the extreme short time.

Figure 23:
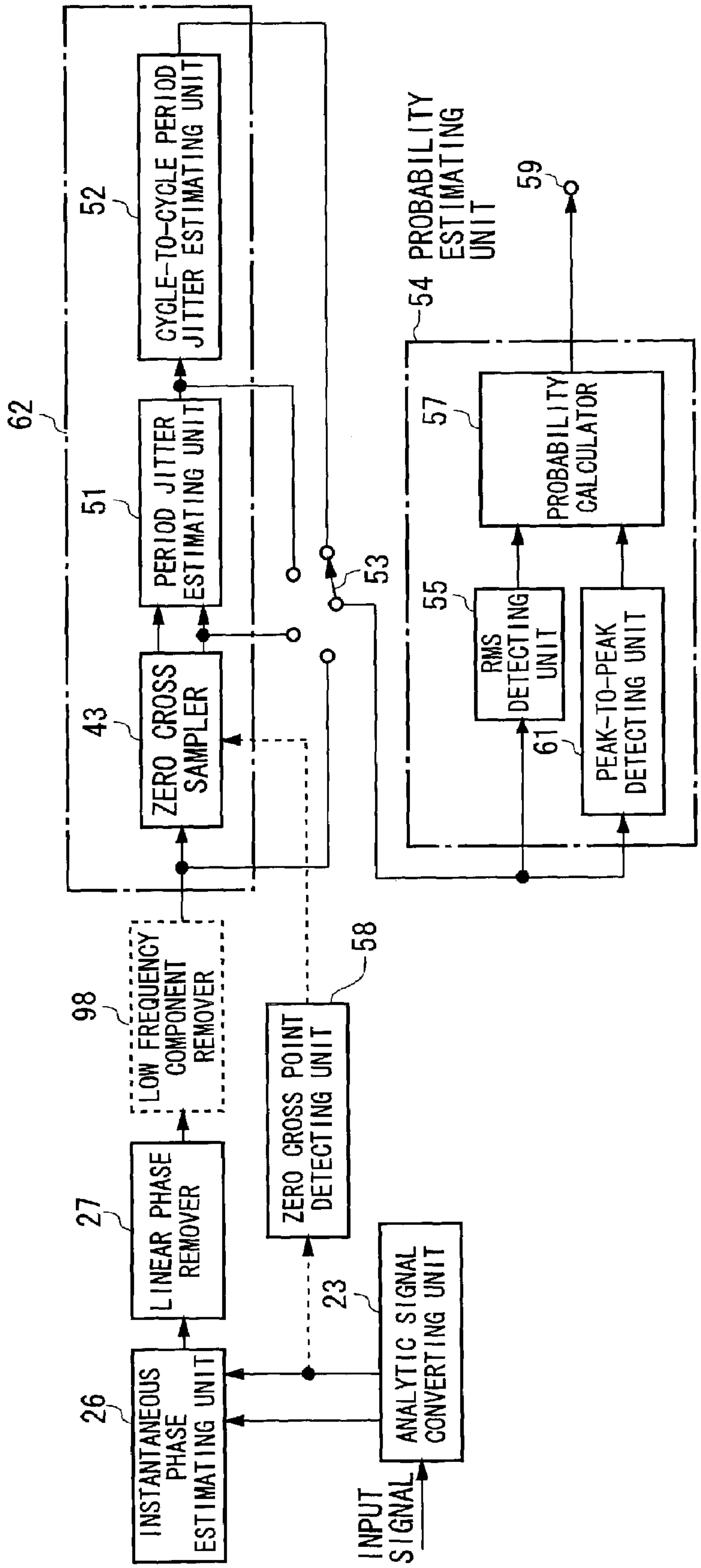
FIG. 23 illustrates another embodiment of the jitter estimating apparatus in the present invention.

FIG. 23 illustrates another embodiment of the jitter estimating apparatus in the present invention. A configuration having the same reference numerals as in FIG. 15 has the same or similar function as/to configuration in FIG. 15.

Probability estimating unit 54 includes RMS detecting unit 55, peak-to-peak detecting unit 61, and probability calculator 57 in the present embodiment. Switch 53 connects either linear phase remover 27, zero cross sampler 43, period jitter estimating unit 51, or cycle-to-cycle period jitter estimating unit 52 to RMS detecting unit 55 and peak-to-peak detecting unit 61 included in probability estimating unit 54.

In a case where probability in which peak-to-peak value $\Delta\phi_{pp}$ in phase noise waveform Δϕ(t) is generated is calculated, switch 53 connects linear phase remover 27 to probability estimating unit 54. RMS detecting unit 55 and peak-to-peak detecting unit 61 receive phase noise waveform Δϕ(t) output from linear phase remover 27.

RMS detecting unit 55 calculates RMS value $\Delta\phi_{RMS}$ of phase noise waveform Δϕ based on phase noise waveform Δϕ(t). Peak-to-peak detecting unit 61 calculates peak-to-peak value $\Delta\phi_{pp}$ of phase noise waveform Δϕ(t). Probability calculator 57 receives RMS value $\Delta\phi_{RMS}$ and peak-to-peak value $\Delta\phi_{pp}$ of phase noise waveform Δϕ(t).

Probability calculator 57 calculates probability in which peak-to-peak value $\Delta\phi_{pp}$ of phase noise waveform Δϕ(t) is generated based on RMS value $\Delta\phi_{RMS}$ and peak-to-peak value $\Delta\phi_{pp}$ of phase noise waveform Δϕ(t).

In a case where probability in which peak-to-peak value $\Delta\phi_{pp}$ of timing jitter Δϕ[k] is generated is calculated, switch 53 connects zero cross sampler 43 to probability estimating unit 54. RMS detecting unit 55 and peak-to-peak detecting unit 61 receive timing jitter Δϕ[k] output from zero cross sampler 43.

RMS detecting unit 55 calculates RMS value $\Delta\phi_{RMS}$ of timing jitter Δϕ[k] by the formula (17) based on timing jitter Δϕ[k]. Peak-to-peak detecting unit 61 calculates peak-to-peak value $\Delta\phi_{pp}$ of timing jitter Δϕ[k] by the formula (16).

Probability calculator 57 receives RMS value $\Delta\phi_{RMS}$ and peak-to-peak value $\Delta\phi_{pp}$ of timing jitter Δϕ sequence [k]. Probability calculator 57 calculates probability in which peak-to-peak value Δϕpp of timing jitter Δϕ[k] is generated based on RMS value $\Delta\phi_{RMS}$ and peak-to-peak value $\Delta\phi_{pp}$ of timing jitter sequence Δϕ[k].

In a case where probability in which peak-to-peak value $J_{pp}$ of period jitter $J_p$ is generated is calculated, switch 53 connects period jitter estimating unit 51 to probability estimating unit 54. RMS detecting unit 55 and peak-to-peak detecting unit 61 receive period jitter sequence J[k] output from period jitter estimating unit 51.

RMS detecting unit 55 calculates RMS value $J_{RMS}$ of period jitter J[k] by the formula (23) based on period jitter J[k]. Peak-to-peak detecting unit 61 calculates peak-to-peak value $J_{pp}$ of period jitter J[k] by the formula (24).

Probability calculator 57 receives RMS value $J_{RMS}$ and peak-to-peak value $\Delta J_{pp}$ of period jitter J[k]. Probability calculator 57 calculates probability in which period jitter J[k] exceeds peak-to-peak value $J_{pp}$ based on RMS value $J_{RMS}$ and peak-to-peak value $J_{pp}$ of period jitter J[k]. Probability calculator 57 receives RMS value $J_{RMS}$ of period jitter J[k] and peak-to-peak value $J_{pp}$.

In a case where probability in which peak-to-peak value $J_{cc,pp}$ of cycle-to-cycle period jitter $J_{cc}$ is generated is calculated, switch 53 connects cycle-to-cycle period jitter estimating unit 52 to probability estimating unit 54. RMS detecting unit 55 and peak-to-peak detecting unit 61 receive cycle-to-cycle period jitter $J_{cc}$ output from cycle-to-cycle period estimating unit 52.

RMS detecting unit 55 calculates RMS value $J_{cc,RMS}$ of cycle-to-cycle period jitter $J_{cc}$ by the formula (26) based on cycle-to-cycle period jitter $J_{cc}$. Peak-to-peak detecting unit 61 calculates peak-to-peak value $J_{cc,pp}$ of cycle-to-cycle period jitter $J_{cc}$ by the formula (27).

Probability calculator 57 receives RMS value $J_{cc,RMS}$ and peak-to-peak value $J_{cc,pp}$ of cycle-to-cycle period jitter $J_{cc}$. Probability calculator 57 calculates probability in which peak-to-peak value $J_{cc,pp}$ of cycle-to-cycle period jitter $J_{cc}$ is generated is calculated based on RMS value $J_{cc,RMS}$ and peak-to-peak value $J_{cc,pp}$ of cycle-to-cycle period jitter $J_{cc}$.

The jitter estimating apparatus in the present embodiment can also calculate probability in which a peak value in each of various jitter is generated. In this case, probability estimating unit 54 includes a peak detecting unit to calculate the peak value of jitter sequence. Probability calculator 57 receives the peak value calculated by the peak detecting unit and probability in which the peak value of jitter is generated can be calculated by the formula (2).

Jitter sequence estimating unit 62 may have a configuration of only zero cross sampler 43 or two configurations of zero cross sampler 43 and period jitter estimating unit 51 among zero cross sampler 43, period jitter estimating unit 51, and cycle-to-cycle period jitter estimating unit 52 in an example of the jitter estimating apparatus shown in FIGS. 15 and 23. In this case, switch 53 connects any included in jitter sequence estimating unit 62 to probability estimating unit 54.

The jitter estimating unit may provide switch 53 so that two or three among linear phase remover 27, zero cross sampler 43, period jitter estimating unit 51, and cycle-to-cycle period jitter estimating unit 52 are connected to probability estimating unit 54. The jitter estimating apparatus may provide probability estimating unit 54 for each output of linear phase remover 27, zero cross sampler 43, period jitter estimating unit 51, and cycle-to-cycle period jitter estimating unit 52. RMS detecting unit 55 may supply a value prior to extraction of the square calculation in RMS detecting unit 55, for example, a value shown by the following formula to probability calculator 57.

$$\sigma^2 = (1/M)\sum_{k=1}^{M} J^2[k]$$

The jitter estimating apparatus may further provide waveform clipper 67. Waveform clipper 67 receives the tested signal output from tested PLL 11, shapes signal waveform of the tested signal, and supplies the shaped tested signal to ADC 22. The jitter estimating apparatus can keep substantially constant amplitude of the tested signal by providing waveform clipper 67. Influence received by phase noise waveform $\Delta\phi(t)$ can be reduced greatly by amplitude modulation, and jitter can be measured precisely. In another example, ADC 22 may perform a process similar to a process of waveform clipper 67.

The jitter estimating apparatus may further provide low frequency component remover 98 to receive phase noise waveform $\Delta\phi(t)$ and to remove low frequency component from phase noise waveform $\Delta\phi(t)$. In this case, switch 53 preferably connects any of low frequency component remover 98, zero cross sampler 43, period jitter estimating unit 51, and the cycle-to-cycle period jitter estimating unit to the probability estimating unit 54. The jitter estimating apparatus can remove low frequency sufficiently lower than frequency of tested signal $x_c(t)$ by providing low frequency component remover 98. It is possible to prevent overestimating peak-to-peak jitter.

Figure 24:
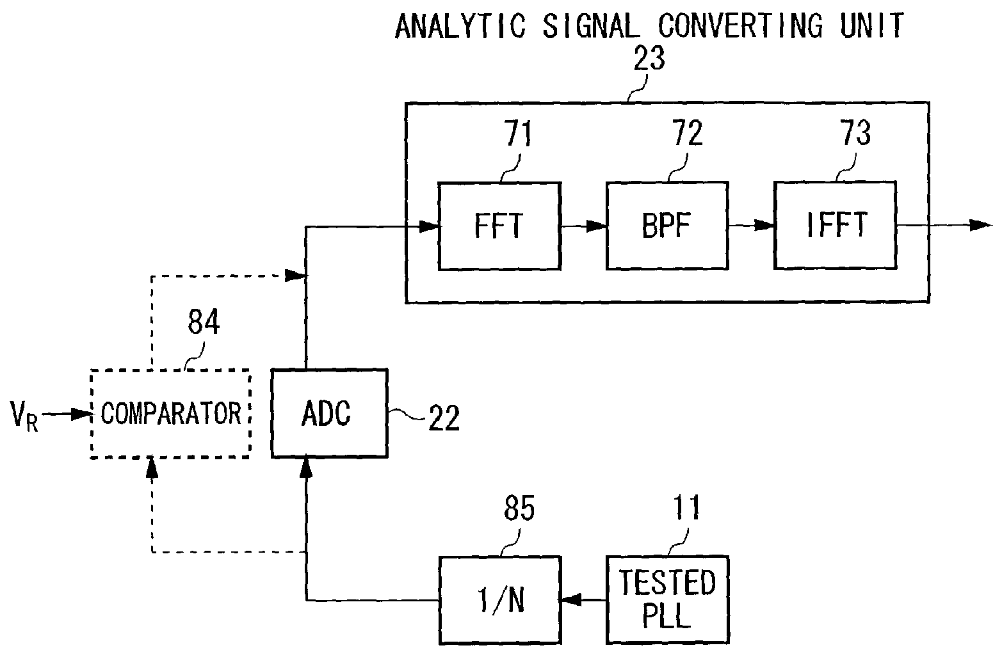
FIG. 24 illustrates one example of an analytic signal converting unit 23.

FIG. 24 illustrates one example of the analytic signal converting unit 23. Analytic signal converting unit 23 includes frequency domain converting unit 71, band pass filter (BPF) 72, and time domain converting unit 73. Frequency domain converting unit 71 receives the tested signal converted in ADC 22 and transforms the received tested signal into a two-sided spectrum signal in a frequency domain by high-speed Fourier transformation (FFT) for example.

In the present embodiment, band pass filter 72 shields a prescribed frequency component in the two-sided spectrum signal. Band pass filter 72 shields a negative frequency component in the two-sided spectrum signal and extracts a frequency component near a positive fundamental frequency in the tested signal. Band pass filter 72 may increase a level of the tested signal including the extracted frequency component. Time domain converting unit 73 transforms the tested signal supplied from band pass filter 72 into analytic signal $z_c(t)$ by inverse Fourier transformation (IFFT).

The jitter estimating apparatus may further have a frequency divider 85 to divide a frequency of the tested signal output from tested PLL 11. The frequency of the tested signal can lower by providing frequency divider 85. The jitter estimating apparatus may provide a frequency converting unit (not shown) to generate a signal with a difference frequency of a local signal without jitter substantially and the tested signal, and to supply the generated signal to analytic signal converting unit 23.

The jitter estimating apparatus may have comparator 84 instead of ADC 22. In this case, comparator 84 receives the tested signal, converts the tested signal into a logic high or a logic low based on reference voltage $V_R$ supplied to comparator 84. That is, comparator 84 converts the received signal into one-bit digital data to supply the converted data to analytic signal converting unit 23.

Figure 25:
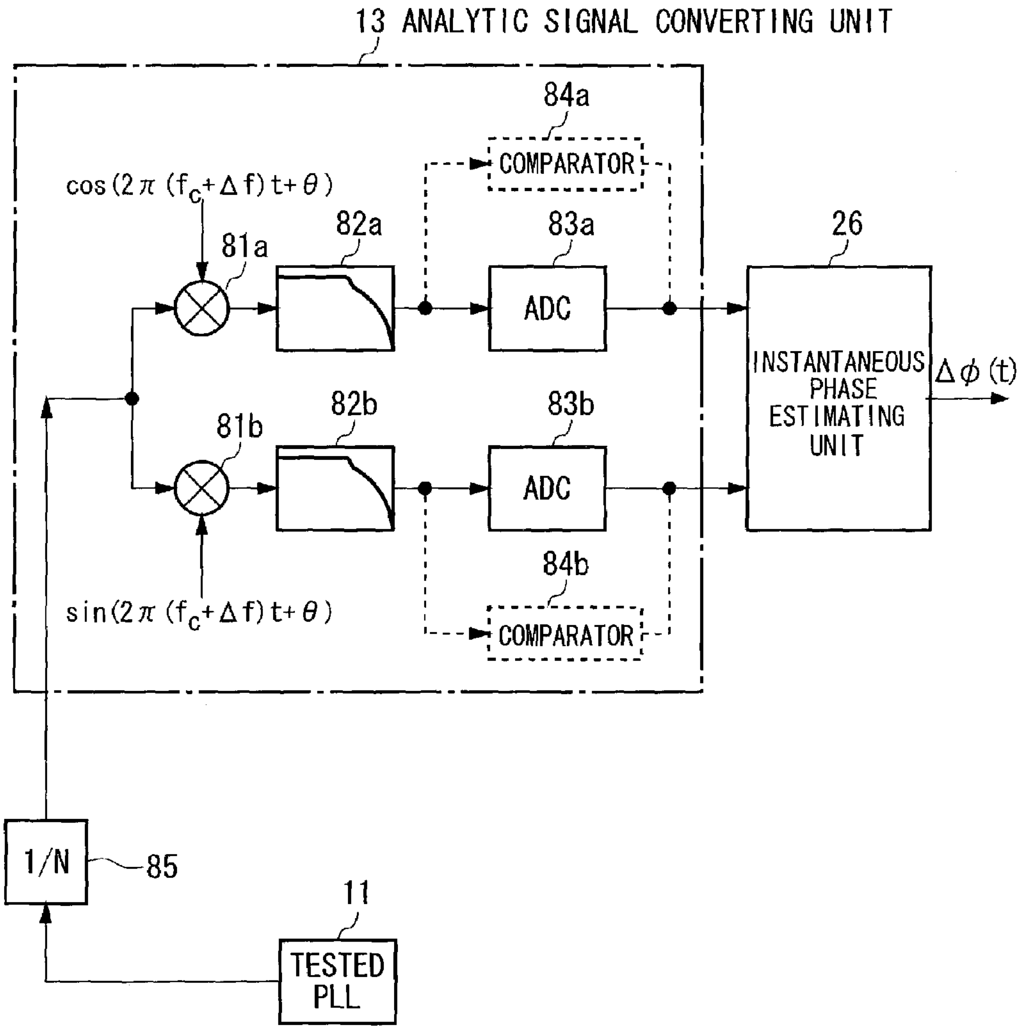
FIG. 25 illustrates another example of the analytic signal converting unit 23.

FIG. 25 illustrates another example of analytic signal converting unit 23. Analytic signal converting unit 23 has frequency mixing unit 81, low pass filter 82, and A/D converting unit 83. Frequency mixing unit 81 mixes tested signal $x_c(t)$ with a signal with a prescribed frequency component. In the present embodiment, frequency mixing units 81*a* and 81*b* respectively perform frequency-mixing for tested signals $x_c(t)$ with $\cos(2\pi(f_c+\Delta f)t+\theta)$ and $\sin(2\pi(f_c+\Delta f)t+\theta)$.

Low pass filters 82*a* and 82*b* respectively calculate analytic signals obtained in the following formula by extracting a difference frequency component between signals each of which is frequency-mixed by frequency mixing units 81*a* and 81*b*.

$$z_c(t)=(A_c/2)[\cos(2\pi\Delta ft+(\theta-\theta_c)-\Delta\phi(t))+j\sin(2\pi\Delta ft+(\theta-\theta_c)-\Delta\phi(t))]$$

Each of an A/D converting units 83*a* and 83*b* performs A/D conversion respectively for real number part and imaginary number part of the analytic signal $z_c(t)$, and supplies them to instantaneous phase estimating unit 26. Analytic signal converting unit 23 may have comparator 84 instead of A/D converting unit 83 in another example. Comparator 84 converts each of a real number part and an imaginary number part of received analytic signal $z_c(t)$ into logic high or logic low, that is, one-bit digital data, and supplies the converted data to instantaneous phase estimating unit 26.

The jitter estimating apparatus may further have frequency divider 85 to divide a frequency of the tested signal output from tested PLL 11. The frequency of the tested signal can be lowered by having frequency divider 85. The jitter estimating apparatus may provide a frequency converting unit (not shown) to generate a signal with a difference frequency between a local signal without jitter substantially and the tested signal, and to supply the generated signal to analytic signal converting unit 23.

Figure 26:
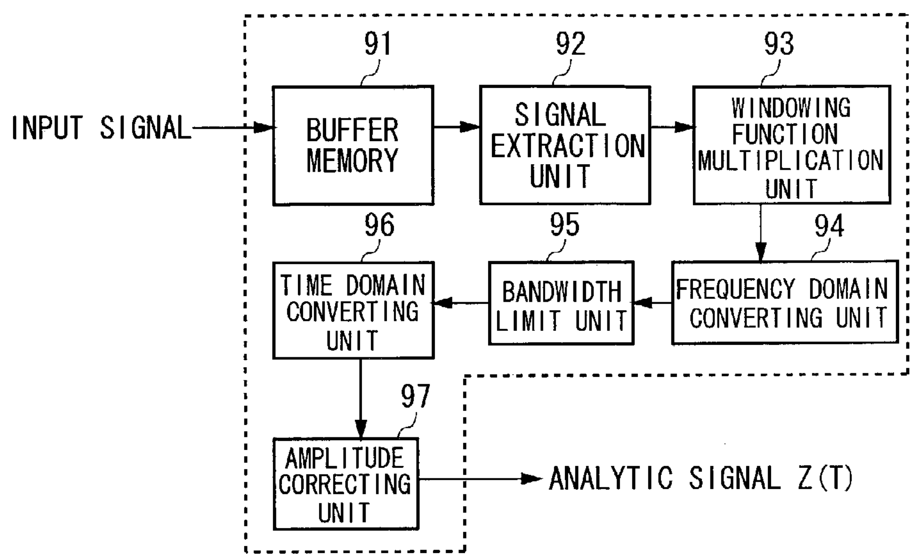
FIG. 26 illustrates another example of the analytic signal converting unit 23.

FIG. 26 illustrates another embodiment of analytic signal converting unit 23. Analytic signal converting unit 23 includes buffer memory 91, signal extraction unit 92, windowing function multiplication unit 93, frequency domain converting unit 94, bandwidth limit unit 95, time domain converting unit 96, and amplitude correcting unit 97.

Buffer memory 91 receives and stores a tested signal digitalized by A/D converting unit 22 (see FIGS. 15 and 23). Signal extraction unit 92 extract tested signal stored in buffer memory 91. Signal extraction unit 92 desirably extracts the signal by reduplicating data and one portion of the tested signal extracted previously, in a case where the tested signal stored in buffer memory 91 is extracted.

Windowing function multiplication unit 93 multiplies the signal extracted by signal extraction unit 92 by a windowing function. Frequency domain converting unit 94 converts the signal in which the windowing function is multiplied into two-sided spectrum signal in a frequency domain by high-speed Fourier transformation. Bandwidth limit unit 95 limits bandwidth of the two-sided spectrum signal. Bandwidth limit unit 95 extracts a frequency component around a fundamental frequency of the tested signal to a one-sided spectrum signal of which a negative frequency component is almost zero in the present embodiment.

Time domain converting unit 96 transforms a signal output from bandwidth limit unit 95 into a time domain signal by inverse high-speed-Fourier transformation. Amplitude correcting unit 97 calculates an analytic signal by multiplying the time domain signal by the inverse windowing function to output the multiplied signal.

Figure 27:
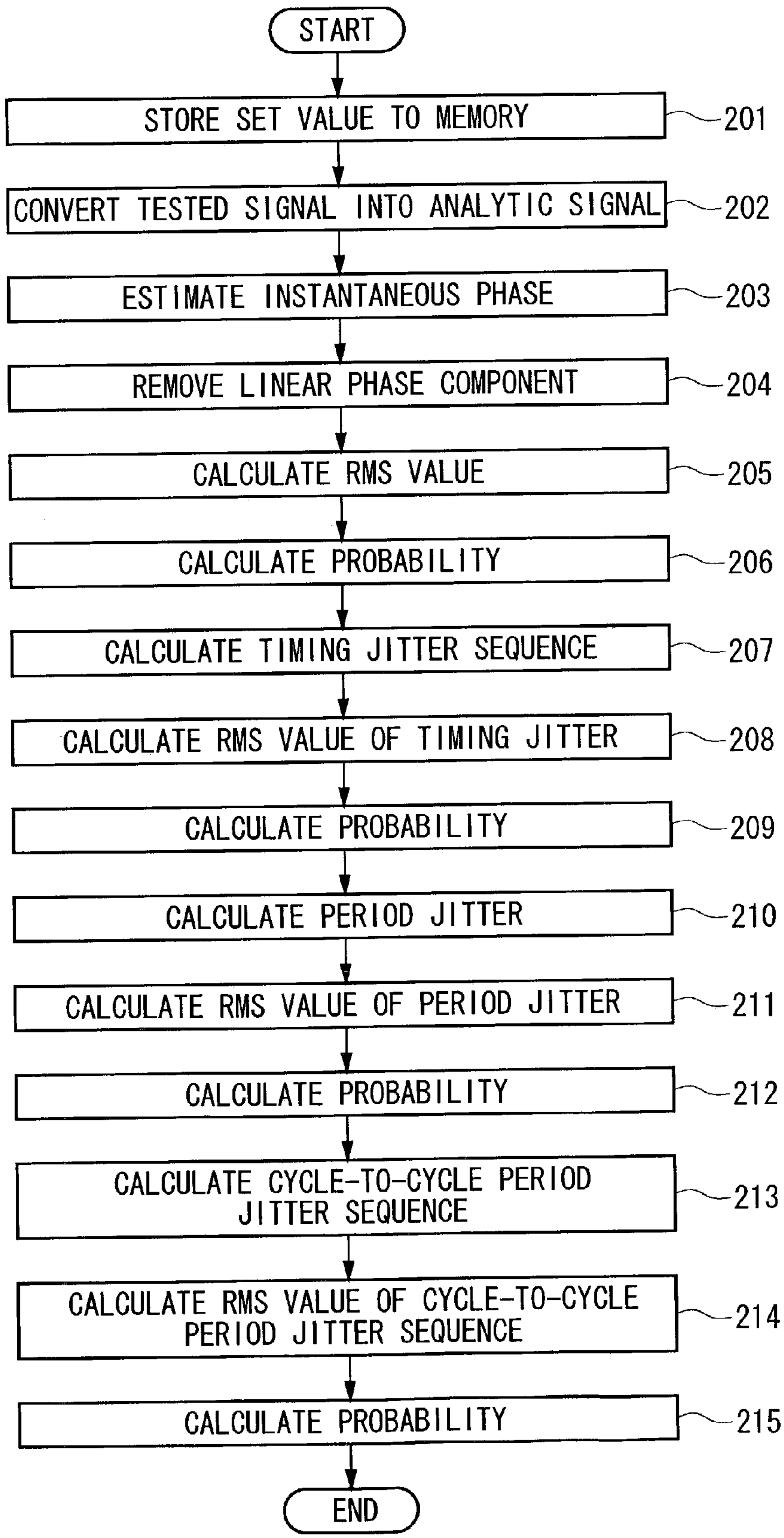
FIG. 27 is a flowchart showing one example of the jitter estimating method in the present invention.

FIG. 27 is a flowchart showing one example of the jitter estimating method in the present invention. The jitter estimating method will be described referring to FIG. 15. At first, the desired peak-to-peak value, for example, such as $\hat{J}_{pk}$ is stored in memory 56 (S201). Next, the tested signal is converted into an analytic signal of which the bandwidth is limited by analytic signal converting unit 23 (S202). An instantaneous phase of the tested signal is estimated by instantaneous phase estimating unit 26 using the analytic signal (S203).

The linear phase component is removed from the obtained instantaneous phase by linear phase remover 27 and phase noise waveform $\Delta\phi(t)$ of the tested signal is estimated (S204). Linear phase remover 27 and probability estimating unit 54 are connected by switching switch 53 and RMS value of phase noise waveform $\Delta\phi(t)$ is calculated by RMS detecting unit 55 (S205). Probability, in which the peak-to-peak value of phase noise waveform $\Delta\phi(t)$ exceeds the set value is calculated by probability calculator 57 based on calculated RMS value and the set value set in S201 (S206).

Successively, timing jitter sequence is calculated by sampling phase noise waveform $\Delta\phi(t)$ with zero cross sampler 43 (S207). In this case, it is preferable to sample data which is close to zero cross timing of phase noise waveform $\Delta\phi(t)$. Zero cross sampler 43 and probability estimating unit 54 are connected by switching switch 53, and RMS value of timing jitter sequence is calculated by RMS detecting unit 55 (S208). Probability in which the peak-to-peak value of timing jitter exceeds the set value is calculated by probability calculator 57 based on calculated RMS value and the set value (peak-to-peak value) set in S201 (S206).

Successively, period jitter sequence is calculated by period jitter estimating unit 51 based on the difference of timing jitter sequence (S210). Next, period jitter estimating unit 51 and probability estimating unit 54 are connected by switching switch 53, and RMS value of period jitter sequence is calculated by RMS detecting unit 55 (S211). Probability in which the peak-to-peak value of period jitter exceeds the set value is calculated by probability calculator 57 based on calculated RMS value and the set value (peak-to-peak value) set in S201 (S212).

Further, cycle-to-cycle period jitter sequence is calculated by cycle-to-cycle period jitter estimating unit 52 based on the difference between period jitter sequences (S213). Next, cycle-to-cycle period jitter estimating unit 52 and probability estimating unit 54 are connected by switching switch 53 and RMS value of cycle-to-cycle period jitter sequence is calculated by RMS detecting unit 55 (S214). Probability in which the peak-to-peak value of cycle-to-cycle period jitter exceeds the set value is calculated by probability calculator 57 based on calculated RMS value and the set value (peak-to-peak value) set in S201 (S215).

The jitter estimating method of the present invention can also calculate probability in which the peak value of each kind of jitter exceeds the set value. In this case, a peak value to calculate probability in which the peak value of each kind of jitter exceeds the prescribed value is stored in memory 56 in S201. Probability in which the peak value of each jitter exceeds the set value is calculated by probability calculator 57 based on RMS value of each kind of jitter and the peak value stored in memory 56 in each of S206, S209, S212, and S215.

Figure 28:
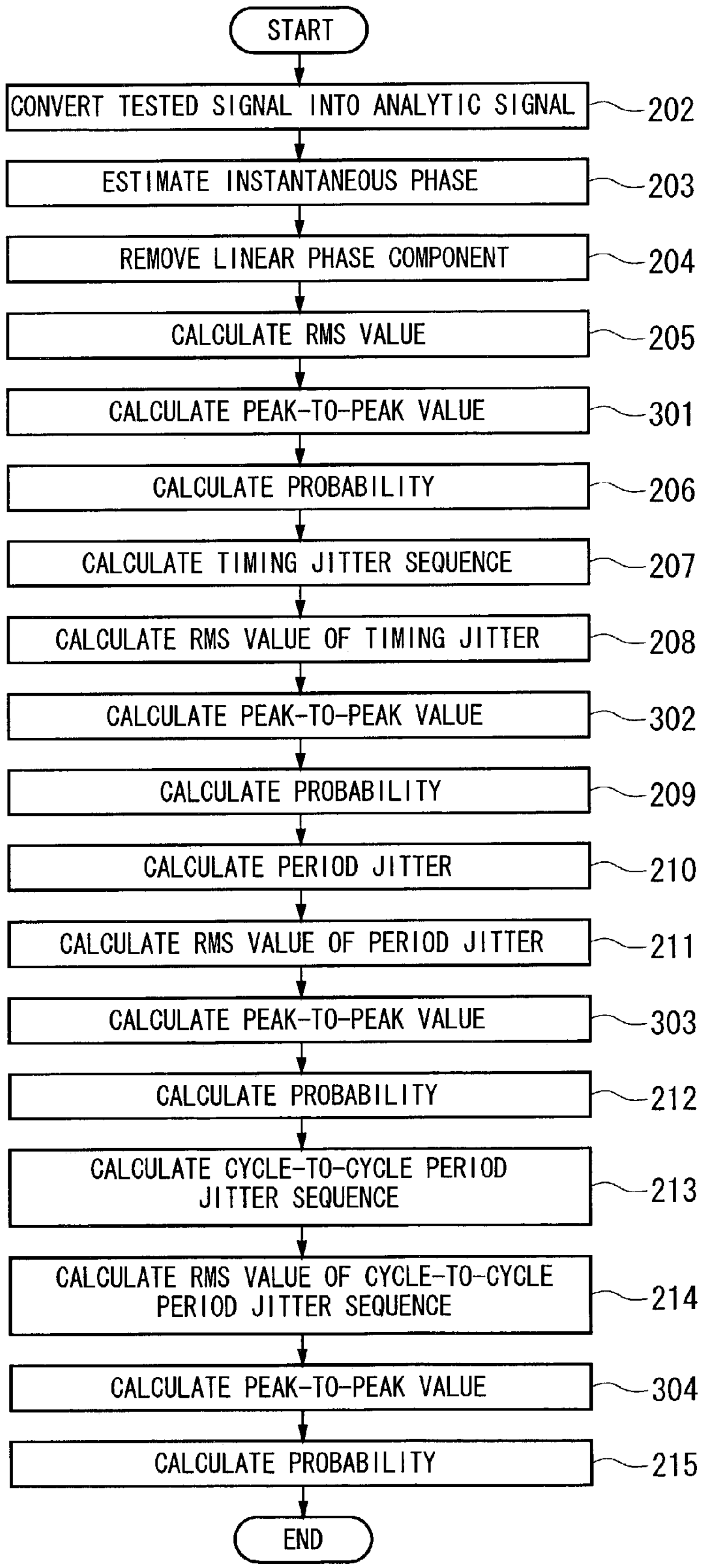
FIG. 28 illustrates a flowchart showing another example of the jitter estimating method.

FIG. 28 illustrates a flowchart of another example of the jitter estimating method. The jitter estimating method will be described referring to FIG. 23. The same reference numeral as FIG. 27 is applied for a step corresponding to FIG. 27. A step different from an example of the jitter estimating method described in FIG. 27 will be described.

Since the peak-to-peak value is calculated in the jitter estimating method of the present embodiment, the method need not have a step (S201) of storing the set value in memory 56 (see FIG. 15). After RMS value of phase noise waveform is calculated in S205, the peak-to-peak value is calculated by peak-to-peak detecting unit 61 based on the difference between a maximum value and a minimum value of phase noise waveform (S301). In S206, probability in which the peak-to-peak value of phase noise waveform is generated is calculated by probability calculator 57 based on RMS value and the peak-to-peak value calculated in S301.

After RMS value of timing jitter sequence is calculated in S208, the peak-to-peak value is calculated by peak-to-peak detecting unit 61 based on the difference of the maximum and the minimum value of timing jitter (S302). In S209, probability in which the peak-to-peak value of timing jitter is generated is calculated by probability calculator 57 based on RMS value and the peak-to-peak value calculated in S302.

After RMS value of period jitter sequence is calculated in S211, the peak-to-peak value is calculated by peak-to-peak detecting unit 61 based on the difference of the maximum value and the minimum value of period jitter (S303). In S209, probability in which the peak-to-peak value of period jitter is generated is calculated by probability calculator 57 based on RMS value and the peak-to-peak value calculated in S303.

After RMS value of cycle-to-cycle period jitter sequence is calculated in S214, the peak-to-peak value is calculated by peak-to-peak detecting unit 61 based on the difference of the maximum and the minimum value of cycle-to-cycle period jitter (S304). In S215, probability in which the peak-to-peak value of cycle-to-cycle period jitter is generated is calculated by probability calculator 57 based on RMS value and the peak-to-peak value calculated in S304.

The jitter estimating method of the present invention can calculate probability in which the peak value of each jitter exceeds the set value. In this case, a peak value of each jitter is calculated by peak detecting unit, which can calculate the peak value of each jitter in S301 to S304. Probability in which each jitter exceeds the peak value is calculated by probability calculator 57 based on each RMS value of jitter and the calculated peak value in each of S206, S209, S212, and S215.

Figure 29:
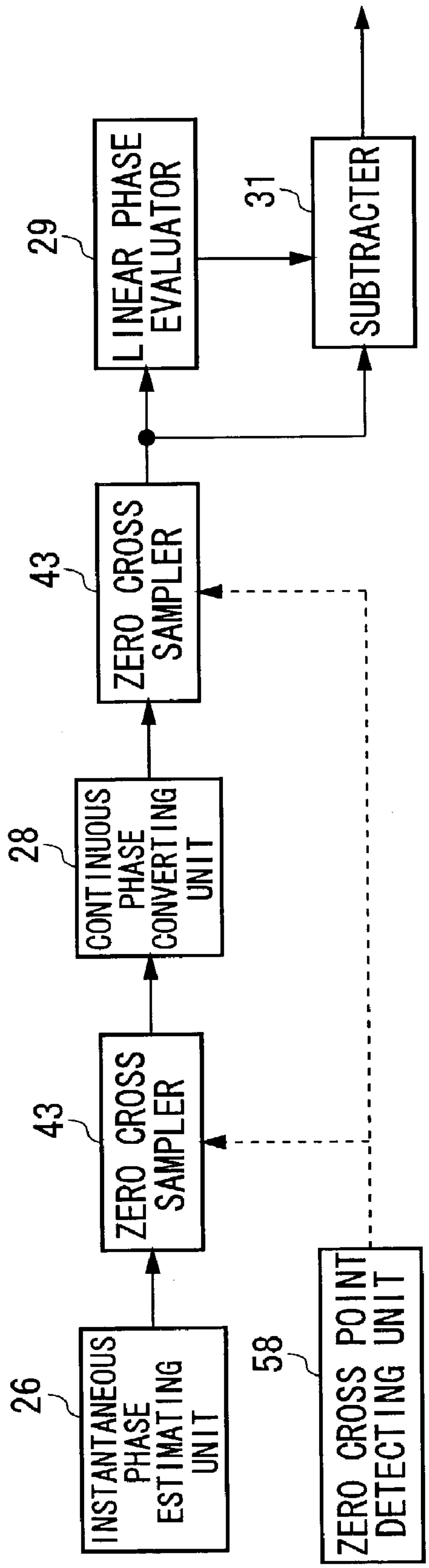
FIG. 29 illustrates another example of a linear phase remover 27.

FIG. 29 illustrates another example of linear phase remover 27. Linear phase remover 27 in this example has zero cross sampler 43 between instantaneous phase estimating unit 26 and continuous phase converter 28 or between continuous phase converter 28 and linear phase evaluator 29. Timing jitter sequence $\Delta\phi[n]$ may be calculated by sampling a signal output from instantaneous phase estimating unit 26 or continuous phase converter 28 at an approximate zero cross point.

Figure 30:
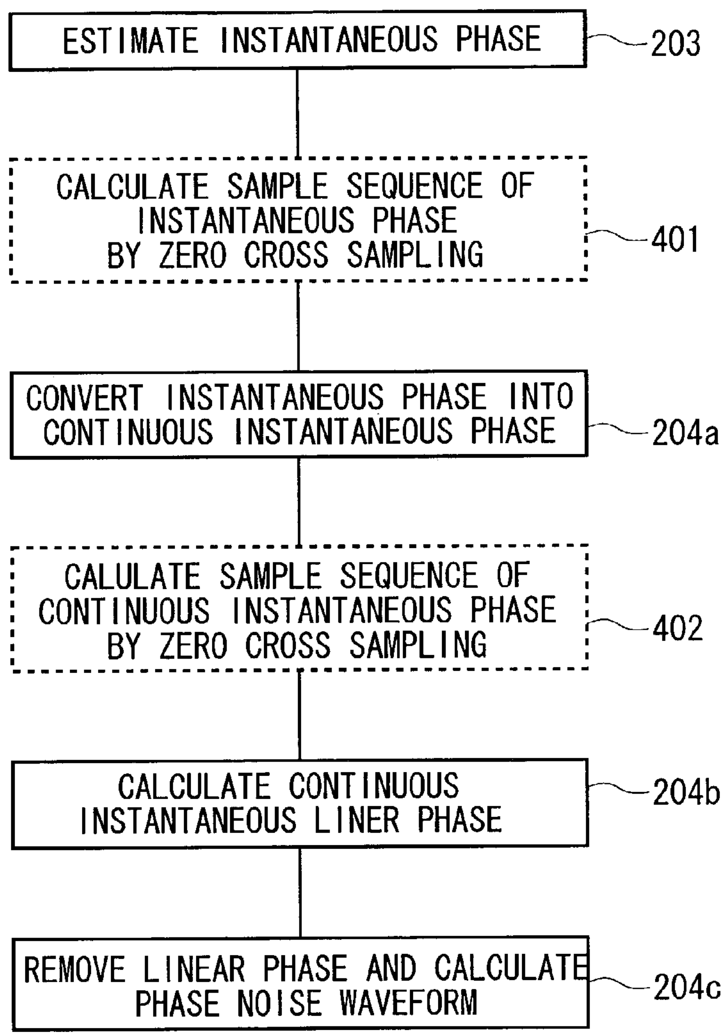
FIG. 30 illustrates one part of a flowchart of the jitter estimating method of measuring jitter using the linear phase remover 27 in FIG. 29.

FIG. 30 illustrates one part of a flowchart of a jitter estimating method for estimating jitter using linear phase remover 27 in FIG. 29. After an instantaneous phase of the tested signal is estimated in S203, the instantaneous phase is converted into a continuous instantaneous phase by continuous phase converting unit 28 (S204*a*). An instantaneous linear phase is calculated by linear phase estimating unit 29 from the continuous instantaneous phase (S204*b*). Noise phase waveform $\Delta\phi(t)$ is calculated by subtracter 31 by removing the instantaneous linear phase from the continuous instantaneous phase.

As shown in FIG. 29, in a case where zero cross sampler 43 is provided between instantaneous phase estimating unit 26 and continuous phase converting unit 28, sample sequence of the instantaneous phase is calculated by approximate zero sampling of the instantaneous phase estimated in S203 (S401). In S204*a*, the continuous instantaneous phase is calculated based on the sample sequence. The continuous instantaneous linear phase is calculated in S204 and timing jitter sequence $\Delta\phi[n]$ is calculated by removing the continuous instantaneous linear phase from sample sequence in S204*c*.

In a case where zero cross sampler 43 is provided between continuous phase converting unit 28 and linear phase evaluator 29, sample sequence of the continuous instantaneous phase is calculated by approximate zero sampling of the continuous instantaneous phase calculated in S204*a*. In S204*b*, the continuous instantaneous linear phase is calculated and timing jitter sequence $\Delta\phi[n]$ is calculated by removing the continuous instantaneous linear phase from sample sequence S204*c*.

The jitter estimating apparatus and the method of the present invention can be used for estimating jitter of, not only a clock signal of a microprocessor but also a clock signal used for another device or a signal with periodicity such as a sine wave signal, as the tested signal. The jitter estimating method described in each embodiment may perform by a program having a module corresponding to each step. The program may be stored in a recording medium and may control the jitter estimating apparatus by reading the program stored in the recording medium and executing the read program with, for example, a computer.

According to the present invention, a worst value of jitter can be estimated precisely in extreme short time. Probability in which the peak jitter and peak-to-peak exceed a prescribed value of such as the peak value and the peak-to-peak value can be calculated.

Although the present invention has been described by way of exemplary embodiment, the scope of the present invention is not limited to the foregoing embodiment. Various modifications in the foregoing embodiment may be made when the present invention defined in the appended claims is enforced. It is obvious from the definition of the appended claims that embodiments with such modifications also belong to the scope of the present invention.

What is claimed is:

1. A jitter estimating apparatus for estimating jitter of an input signal, comprising: a phase noise detecting unit for calculating phase noise waveform of said input signal; and a worst value estimating unit for calculating a worst value of jitter of said input signal based on the phase noise waveform, said worst value representing an extremum of a peak value of said jitter in said input signal.

2. A jitter estimating apparatus as claimed in claim 1, wherein said worst value estimating unit includes an absolute value calculator for calculating a absolute value of the phase noise waveform, a maximum value calculator for calculating a maximum value of the absolute value; and a constant multiplication unit for calculating multiplied value multiplying the maximum value by constant as the worst value.

3. A jitter estimating apparatus as claimed in claim 2, wherein said constant multiplication unit comprises a means for calculating the worst value of a peak value of jitter in the input signal by approximately double the maximum value.

4. A jitter estimating apparatus as claimed in claim 3 further comprising a period jitter estimating unit for calculating period jitter of the input signal.

5. A jitter estimating apparatus as claimed in claim 3 further comprising: a timing jitter estimating unit for calculating timing jitter sequence of the input signal; a period jitter estimating unit for calculating period jitter sequence of the input signal based on the timing jitter sequence; an RMS detecting unit for calculating a square mean of the period jitter sequence; and a probability calculator for calculating probability in which a worst value of the peak value is generated based on the square mean and the worst value of the said peak value.

6. A jitter estimating apparatus as claimed in claim 2, wherein said constant multiplication unit comprises a means for calculating a worst value of a peak-to-peak value of jitter in the input signal by approximately quadruple the maximum value.

7. A jitter estimating apparatus as claimed in claim 6 further comprising: a timing jitter estimating unit for calculating timing jitter sequence of the input signal based on the phase noise waveform; a period jitter estimating unit for calculating period jitter sequence of the input signal based on the timing jitter sequence; an RMS detecting unit for calculating a square mean of the period jitter sequence; and a probability calculator for calculating probability in which a worst value of the peak-to-peak value is generated based on the square mean and the worst value of the peak-to-peak value.

8. A jitter estimating apparatus for estimating jitter of an input signal, comprising: a phase noise detecting unit for calculating phase noise waveform of the input signal; and a probability estimating unit for calculating probability in which peak jitter and/or peak-to-peak jitter of the input signal are/is generated, wherein the probability is calculated according to Rayleigh distribution when a distribution of the phase noise waveforms depends on Gaussian distribution.

9. A jitter estimating apparatus as claimed in claim 8 further comprising a timing jitter estimating unit for calculating timing jitter sequence of the input signal based on the phase noise waveform, wherein said probability estimating unit detects probability in which peak jitter and/or peak-to-peak jitter of the input signal are/is generated based on the timing jitter sequence.

10. A jitter estimating apparatus as claimed in claim 9 further comprising a low frequency component remover for removing a frequency component lower than a prescribed frequency from the phase noise waveform, wherein said timing jitter estimating unit calculates timing jitter sequence of the input signal based on the phase noise waveform from which the frequency component is removed.

11. A jitter estimating apparatus as claimed in claim 8, wherein said probability estimating unit comprises an RMS detecting unit for calculating a square mean of the phase noise waveform; and a probability calculator for calculating probability in which peak jitter or peak-to-peak jitter of the input signal exceeds a prescribed value based on the square mean.

12. A jitter estimating apparatus as claimed in claim 8, wherein said probability estimating unit comprises: an RMS detecting unit for calculating a square mean of the phase noise waveform; a peak-to-peak detecting unit for calculating a peak value and/or peak-to-peak value of timing jitter of the input signal based on the phase noise waveform; and a probability calculator for calculating probability in which peak jitter or peak-to-peak jitter of the input signal exceeds the peak value or the peak-to-peak value based on the square mean, the peak value or the peak-to-peak value.

13. A jitter estimating apparatus as claimed 8, wherein said phase noise detecting unit comprises: an analytic signal converting unit for converting the input signal into an analytic signal of a complex function; an instantaneous phase estimating unit for calculating an instantaneous phase of the analytic signal; and a linear phase remover for calculating the phase noise waveform by removing a linear phase from the instantaneous phase.

14. A jitter estimating apparatus as claimed in claim 9, wherein said phase noise detecting unit comprises: an analytic signal converting unit for converting said input signal into an analytic signal of a complex function; an instantaneous phase estimating unit for calculating an instantaneous phase of said analytic signal; and a linear phase remover for calculating said phase noise waveform by removing a linear phase from said instantaneous phase.

15. A jitter estimating apparatus as claimed in claim 13 further comprising a waveform clipper for removing an amplitude modulating component of the input signal, wherein said analytic signal converting unit converts the input signal from which the amplitude modulating component is removed into the analytic signal.

16. A jitter estimating apparatus as claimed in claim 13, wherein a zero cross detecting unit outputs timing in which the analytic signal is sampled and data near a zero cross point among data of the sampled analytic signal are sampled, and said timing jitter estimating unit calculates timing jitter sequence of the input signal by sampling the phase noise waveform based on the timing.

17. A jitter estimating apparatus as claimed in claim 9, further comprising a period jitter estimating unit for calculating period jitter sequence of the input signal based on the timing jitter sequence, wherein said probability estimating unit calculates probability in which a peak value and/or a peak-to-peak value of period jitter of the input signal exceeds a prescribed value based on the period jitter sequence.

18. A jitter estimating apparatus as claimed in claim 16 further comprising a period jitter estimating unit for calculating period jitter sequence of said input signal based on timing jitter sequence, wherein said stochastic probability estimating unit calculates stochastic probability in which a peak value and/or a peak-to-peak value of period jitter of said input signal exceeds a prescribed value based on said period jitter sequence.

19. A jitter estimating apparatus as claimed in claim 16, wherein said period jitter estimating unit comprises a difference calculator for calculating difference sequence between timing jitter included in timing jitter sequence output by said timing jitter estimating unit; an interval calculator for calculating an interval of the timing output by said zero cross detecting unit; and a correcting unit for calculating the period jitter sequence by correcting the difference sequence based on the interval of the timing and a period of the input signal.

20. A jitter estimating apparatus as claimed in claim 17, wherein said period jitter estimating unit further comprises a delay unit for delaying the period jitter sequence calculated by said correcting unit to output the delayed sequence.

21. A jitter estimating apparatus as claimed in claim 16 further comprising a cycle-to-cycle period jitter estimating unit for calculating cycle-to-cycle period jitter of the input signal, wherein said probability estimating unit calculates probability in which a peak value and/or a peak-to-peak value of cycle-to-cycle period jitter of the input signal exceeds a prescribed value based on the cycle-to-cycle period jitter sequence.

22. A jitter estimating apparatus as claimed in claim 19 further comprising a switch for switching whether any of said linear phase remover, said timing jitter estimating unit, said period jitter estimating unit, and said cycle-to-cycle period jitter estimating unit connects to said probability estimating unit.

23. A method of estimating jitter as claimed in claim 21, wherein said step of estimating the worst value comprises steps of calculating an absolute value of the phase noise waveform; calculating a maximum value of an absolute value; and multiplying the maximum value by constant to calculate the multiplied value as the worst value.

24. A method of estimating jitter as claimed in claim 22, wherein said step of multiplying the maximum value by constant has a step of calculating the worst value of a peak value of jitter in the input signal by approximately double said maximum value.

25. A method of estimating jitter as claimed in claim 24, further comprising steps of: calculating timing jitter sequence of the input signal based on the phase noise waveform; calculating period jitter sequence of the input signal based on the timing jitter sequence; calculating a square mean of the period jitter sequence; and calculating probability in which the worst value of the peak-to-peak value is generated based on the square mean and the worst value of the peak-to-peak value.

26. A method of estimating jitter as claimed in claim 25 further comprising a step of removing a frequency component lower than a prescribed frequency from the phase noise waveform, wherein said step of estimating timing jitter calculates timing jitter sequence of the input signal based on the phase noise waveform from which the frequency component is removed.

27. A method of estimating jitter as claimed in claim 25 further comprising a step of estimating period jitter to calculate period jitter sequence of the input signal based on the timing jitter sequence, wherein said step of estimating probability calculates probability in which a peak value and/or peak-to-peak value of period jitter in the input signal exceeds a prescribed value based on the period jitter sequence.

28. A method of estimating jitter of an input signal, comprising steps of: detecting phase noise to calculate phase noise waveform of the input signal; and estimating a worst value to calculate said worst value of jitter in the input signal based on the phase noise waveform, said worst value representing an extremum of a peak value of said jitter in said input signal.

29. A method of estimating jitter as claimed in claim 28, further comprising steps of: calculating timing jitter sequence of the input signal based on the phase noise waveform; calculating period jitter sequence of the input signal based on the timing jitter sequence; calculating a square mean of the period jitter sequence; and calculating probability in which a worst value of the peak value is generated based on the square mean and the worst value of the peak value.

30. A method of estimating jitter as claimed in claim 28, wherein said step of multiplying the maximum value by constant comprises said a step of calculating the worst value of a peak-to-peak value of jitter in the input signal by approximately quadruple the maximum value.

31. A method of estimating jitter as claimed in claim 30 further comprising a step of estimating timing jitter for calculating timing jitter sequence of the input signal based on the phase noise waveform, wherein said step of estimating probability estimates probability in which peak jitter and/or peak-to-peak jitter of the input signal are/is generated based on the timing jitter sequence.

32. A method of estimating jitter as claimed in claim 30, wherein said step of estimating probability comprises steps of: calculating a square mean of the phase noise waveform; and calculating probability in which peak jitter or peak-to-peak jitter of the input signal exceeds a prescribed value based on the square mean.

33. A method of estimating jitter as claimed in claim 30, wherein said step of estimating probability comprises steps of: calculating a square mean of the phase noise waveform; detecting a peak-to-peak to calculate a peak value and/or a peak-to-peak value of timing jitter in the input signal based on the phase noise waveform; and calculating probability in which peak jitter or peak-to-peak jitter of the input signal exceeds the peak value or the peak-to-peak value based on the square mean, and the peak value or the peak-to-peak value.

34. A method of estimating jitter as claimed in claim 30, wherein said step of detecting phase noise comprises steps of: converting an analytic signal to convert the input signal into the analytic signal of a complex function;

calculating an instantaneous phase of the analytic signal; and removing a linear phase to calculate the phase noise waveform by removing a linear phase from the instantaneous phase.

35. A method of estimating jitter as claimed in claim 31, wherein said step of detecting phase noise comprises steps of: converting an analytic signal to convert said input signal into said analytic signal of a complex function; calculating an instantaneous phase of said analytic signal; and removing a linear phase to calculate said phase noise waveform by removing a linear phase from said instantaneous phase.

36. A method of estimating jitter as claimed in claim 32 further comprising a step of removing an amplitude modulating component of the input signal, wherein said step of converting the analytic signal converts the input signal from which the amplitude modulating component is removed into the analytic signal.

37. A method of estimating jitter as claimed in claim 32 further comprising a step of sampling the analytic signal to output timing in which data near a zero cross point among data of the analytic signal are sampled, wherein said step of estimating timing jitter calculates timing jitter sequence of the input signal by sampling the phase noise waveform based on the timing.

38. A method of estimating jitter as claimed in claim 35 further comprising a step of estimating cycle-to-cycle period jitter to calculate cycle-to-cycle period jitter in the input signal based on the period jitter sequence, wherein said step of estimating probability calculates probability in which a peak value and/or peak-to-peak value of cycle-to-cycle period jitter in the input signal exceeds a prescribed value based on the cycle-to-cycle period jitter sequence.

39. A method of estimating jitter as claimed in claim 35, wherein said step of estimating period jitter comprises steps of: calculating difference sequence of timing jitter included in timing jitter sequence output in said step of estimating timing jitter; calculating an interval of the timing output in said step of detecting the zero cross point; and calculating the period jitter sequence by correcting the difference sequence based on the interval of the timing and a period of the input signal.

40. A method of estimating jitter as claimed in claim 36, wherein said step of estimating period jitter further comprises a step of delaying the period jitter sequence calculated in said correcting step to output the delayed sequence.

41. A method of estimating jitter as claimed in claim 37 further comprising a step of estimating period jitter to calculate period jitter sequence of said input signal based on said timing jitter sequence, wherein said step of estimating stochastic probability calculates stochastic probability in which a peak value and/or peak-to-peak value of period jitter in said input signal exceeds a prescribed value.

42. A method of estimating jitter estimating jitter of an input signal, comprising steps of: detecting phase noise for calculating phase noise waveform of the input signal; and estimating probability for calculating probability in which peak jitter and/or peak-to-peak jitter of the input signal are/is generated based on the phase noise waveform, wherein the probability is calculated according to Rayleigh distribution when a distribution of the phase noise waveforms depends on Gaussian distribution.

* * * * *